(12) United States Patent
Yabe et al.

(10) Patent No.: US 6,414,880 B1
(45) Date of Patent: Jul. 2, 2002

(54) MULTIPLE LINE BUFFER TYPE MEMORY LSI

(75) Inventors: Yoshikazu Yabe; Masato Motomura, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/933,820

(22) Filed: Aug. 22, 2001

(30) Foreign Application Priority Data

Aug. 23, 2000 (JP) ........................................ 2000-252413

(51) Int. Cl.$^7$ ................................................. G11C 7/00
(52) U.S. Cl. ............................. 365/189.05; 365/230.03
(58) Field of Search ........................ 365/189.05, 230.03, 365/189.01

(56) References Cited

U.S. PATENT DOCUMENTS 4,882,710 A * 11/1989 Hashimoto et al. .... 365/189.05
4,999,814 A * 3/1991 Hashimoto ............. 365/189.05

OTHER PUBLICATIONS

"128 Mb VC (Virtual Channel) SDRAM Data Sheet", 2000, 10$^{th}$ Edition, pp. 1–92, NEC Corporation.

* cited by examiner

Primary Examiner—Huan Hoang
(74) Attorney, Agent, or Firm—Foley & Lardner

(57) ABSTRACT

In a multiple line buffer type memory LSI, when line buffers retaining data read out from a memory section does not exist in a multiple line buffer section, data retained in any of the line buffers are copied and held temporarily in standby in the write-back buffers. The data read out from the memory section are retained in the line buffers. The data temporarily held in standby in the write-back buffers are written back into the memory section.

9 Claims, 17 Drawing Sheets

| COMMAND | ADDRESS[21:0] | | | | |
|---|---|---|---|---|---|
| APFCA | B | Row | Seg | Ch | Wb |
| ARSTA | B | Row | Seg | – | Wb |
| READ | – | Col | – | Ch | – |
| WRIT | – | Col | – | Ch | – |

MULTIPLE LINE BUFFER TYPE MEMORY LSI

BACKGROUND OF THE INVENTION

This invention broadly relates to a multiple line buffer type memory LSI (Large Scale Integration) in which a plurality of line buffers are added to the memory section. More specifically, this invention is directed to a multiple line buffer type memory LSI which reduces delays in memory access caused by write-back operation from the line buffer to the memory section.

Recently, a great attention has been paid for the multiple line buffer type memory LSI as a technique for achieving higher performance of memory LSIs.

A multiple line buffer type memory LSI is based on a process comprising the steps of adding a multiple line buffer section having a plurality of line buffers to a memory section within a memory LSI, prefetching (previously reading out data) data stored in a memory section to any of the plurality of line buffers, and upon memory access, causing access to the line buffer.

The multiple line buffer type memory LSI has an object to effectively reduce a delay time occurring upon memory access by providing a high-speed-accessible multiple line buffer section as described above.

A typical example of the above-mentioned multiple line buffer type memory LSI is VCM (Virtual Channel Memory) Architecture announced by NEC Corporation. This VCM Architecture is industrialized as a commercial product by the application of 128-Mbit DRAM (Details have been released by NEC Corporation in the name of 128 Mb VC (Virtual Channel) SDRAM Data Sheet.

FIG. 1 is a block diagram illustrating a typical configuration of a related multiple line buffer type memory LSI, schematically showing the block configuration of 128 Mb VC-SDRAM. The conventional multiple line buffer type memory LSI shown in FIG. 1 will hereinafter be referred to as the related art 1.

As shown in FIG. 1, the related art 1 comprises an address buffer 104, a command decoder 105, a control circuit 106, a memory section 107, a multiple line buffer section 108, and a data buffer 109, and has, as external terminals, an address input terminal group 101, a command input terminal group 102 and a data input/output terminal group 103.

A command indicating operational contents in the multiple line buffer type memory LSI is entered into the command input terminal group 102, and the entered command is decoded by the command decoder 105 and entered into the control circuit 106.

An address specifying a place where data in this multiple line buffer type memory LSI are stored is entered into the address input terminal group 1. The entered address is latched by the address buffer 104 and entered into the control circuit 106.

The control circuit 106 controls the memory section 107, the multiple line buffer section 108 and the data buffer 109 on the basis of the input from the command decoder 105 and the address buffer 104.

The memory section 107 includes a row decoder 110, a memory cell array 111 and a sense amplifying section 112.

The memory cell array 111 is divided into pages, which are data transfer units, between the memory cell array and the sense amplifying section 112.

The row decoder 110 selects a page from those in the memory cell array 111 on the basis of the address entered via the address input terminal group 101. The sense amplifying section 112 activates (amplifies) and retains the page selected by the row decoder 110.

The multiple line buffer section 108 is provided with a line selector 113, a column decoder 114, and one or more line buffers 115. Herein, it is to be noted that the line buffer may be referred to as a channel in the related art 1.

Each line buffer 115 is divided into words which are data transfer units between the line buffer and the data buffer 109.

The row decoder 114 selects a word from those in the line buffer 115 on the basis of the address entered via the address input terminal group 101, and the line selector 113 controls the respective line buffers 115.

In the case of an ordinary DRAM (hereinafter referred to as a "page type memory LSI"), data are read out in units of a word from the activated page which is read out into the sense amplifying section.

Herein, it is noted that a typical example of page type memory LSI is SDRAM, the details of which has been published by NEC Corporation as "128 Mb SDRAM Data Sheet".

By contrast, data for the portion called a segment in an activated page are read and written in a lump with the multiple line buffer section 108 in the case of the VC-SDRAM in the related art 1 shown in FIG. 1.

Memory access in the related art 1 is carried out by two-stage operations comprising background operations and foreground operations.

In this event, the background operations mean operations necessary for data transfer in units of a segment conducted between the memory section 107 and the multiple line buffer section 108.

The foreground operations mean data transfer operations in units of a word performed between the multiple line buffer section 108 and the data input/output terminal group 103.

The background operations mainly comprise the following four operations: a page opening operation (ACT command) for activating the page and reading it out into the sense amplifying section 112; a prefetch operation (PFC command) for reading out a desired segment from the page read out (activated) into the sense amplifying section 112 in the memory section 107 into the multiple line buffer section 108; a restore operation (RST command) for writing back the segment into the page read out (activated) into the sense amplifying section 112 in the memory section 107 (RST command); and a page closing operation (PRE command) for preparing for activation by closing the activated page.

On the other hand, the foreground operations mainly includes the following two operations: a buffer read operation (READ command) for reading out a word from a desired line buffer 115 in the multiple line buffer section 108; and a buffer write operation (WRIT command) for writing words into a desired line buffer 115.

In the related art 1, the multiple line buffer section 108 is full-associatively configured. This means that it is possible to read out a segment at an arbitrary position into an arbitrary line buffer 115.

The following three methods are available for memory access in the related art 1, varying with data retained in the line buffer 115.

FIG. 2 is a timing chart illustrating an example of the data read operation in the multiple line buffer type memory LSI shown in FIG. 1.

1. Hitting case (see FIG. 21A): This represents a memory access method applicable when there are data to be accessed in the line buffer 115, and comprises the step of directly accessing (READ) the line buffer 115 storing the data. In this case, memory access can be performed at a high speed.

2. Error case (see FIG. 2B): A memory access method applicable when data to be accessed are not present in the line buffer 115, but there is an overwritable line buffer (a line buffer retaining the same data as in the memory 107, a line buffer not as yet used). This method comprises the steps of transferring the data to be accessed from the memory section to the overwritable line buffer (ACT-PFC), and then, accessing (READ) the line buffer 115.

3. Write-back case (see FIG. 2(C)): The memory access method applicable when the data to be accessed are not present in the line buffer 115 and there is no overwritable line buffer, comprising the steps of first preparing an overwritable line buffer by writing back the data of the line buffer 115 into the memory section 107 (RST), then, transferring the data to be accessed from the memory section 107 to the line buffer 115 made overwritable (ACT-PFC), and then, accessing the line buffer 115 (READ).

In the related art 1, as described above, the aforementioned write-back case necessitates an operation of writing back the data of the line buffer into the memory section, and this data writing-back operation results in a longer delay time of memory access.

SUMMARY OF THE INVENTION

It is therefore an object of this invention to provide a multiple line buffer type memory LSI which is capable of reducing delays in memory access caused by write-back operation of data from the line buffer to the memory section.

To achieve the aforementioned object of the present invention, the invention provides a multiple line buffer type memory LSI having a data input/output terminal group for input/output of data, a memory section in which write and read of data entered or output via the data input/output terminal group are performed, a multiple line buffer section comprising a plurality of line buffers for retaining data previously read out from the memory section, and a control circuit performing control of the apparatus as a whole, in which the line buffers are accessed upon memory access.

The multiple line buffer type memory LSI has one or more write-back buffers retaining copies of the data in the line buffers.

When there is no such line buffer retaining the data read out from the memory section in the multiple line buffer section, the control circuit copies the data retained in any of the line buffers in the multiple line buffer section, causes the write-back buffer to temporarily retain the copies of data, then, causes the line buffer to retain the data read out from the memory section, and writes back the data temporarily retained in the write-back buffer to the memory section.

In an embodiment of the multiple line buffer type memory LSI of the invention, the multiple line buffer type memory LSI has a command input terminal group into which a command for indicating operational contents in the multiple line buffer type memory LSI.

The control circuit can copy the data retained in any of the line buffers in the multiple line buffer section, cause the write-back buffer to temporarily retain the copies of data, and then, cause the line buffer to retain the data read out from the memory section, in response to a command entered into the command input terminal group.

In an embodiment of the multiple line buffer type memory LSI of the invention, the control circuit permits write-back of the data temporarily retained in the write-back buffer into the memory section.

In an embodiment of the multiple line buffer type memory LSI of the invention, the multiple line buffer type memory LSI has a command monitoring circuit which detects as to whether or not the command has been entered into the command input terminal group within a prescribed period of time.

The control circuit automatically writes back the data temporarily retained in the write-back buffer into the memory section in compliance with the result of detection in the command monitoring circuit.

In an embodiment of the multiple line buffer type memory LSI of the invention, the multiple line buffer type memory LSI has an address input terminal group into which an address of indicating a place when the data in the multiple line buffer type memory LSI are stored.

Each of the line buffer and the write-back buffer has an address tag retaining an address specifying the place in the memory from among addresses entered into the address input terminal group.

When causing the data read out from the memory section to be retained in the line buffer, the control circuit writes the address used for the read operation in the address tag of the line buffer. When the data retained in the line buffer are copied and retained temporarily in the write-back buffer, writes the address retained in the address tag of the line buffer into an address tag of the write buffer; and writes back the data temporarily retained in the write-back buffer into the memory section by using the address retained in the address tag of the write-back buffer.

In an embodiment of the multiple line buffer type memory LSI of the invention, the memory section comprises a plurality of banks.

A plurality of the line buffers and the write-back buffers are provided in accordance with the plurality of banks.

In an embodiment of the multiple line buffer type memory LSI of the invention, the write-back buffer may be an FIFO type buffer from which the data are read out in the sequence of write of the data.

The control circuit writes back the data retained in the write-back buffer into the memory section in the sequence in which the data of the line buffer have been retained in the write-back buffer.

In an embodiment of the multiple line buffer type memory LSI of the invention, the multiple line buffer type memory LSI has a data line pair having two wiring lines for connecting the memory section, the line buffer and the write-back buffer to each other.

The memory section, the line buffer and the write-back buffer perform mutual data transfer by means of a micro-potential difference from a certain reference potential of the data line pair.

An embodiment of the multiple line buffer type memory LSI of the invention, further comprises switches for switching over the data line pair between a turn-on state and a turn-off state of the memory section, the line buffer and the write-back buffer, respectively.

Buffer circuits with amplifying function for amplifying the micro-potential difference of the data line pair are arranged in the line buffer and the write-back buffer, respectively.

In the present invention having the above-mentioned configuration, one or more write-back buffers retaining copies of data in the line buffer are provided. When there is no line buffer retaining data read out from the memory section, the data retained in any of the plurality of line buffers are copied and temporarily retained in the write-back buffer.

Data transfer from the line buffer to the write-back buffer can be performed at a high speed as compared with data transfer from the line buffer to the memory section, and data write-back operation can be carried out at any time into the memory section unless the data of the write-back buffer are rewritten. It is therefore possible to temporarily retain copies of data of the line buffer in the write-back buffer, and then immediately execute access to the line buffer. This reduces delays in access caused by data write-back operation.

DESCRIPTION OF PREFERRED EMBODIMENTS

First Embodiment

Figure 3:
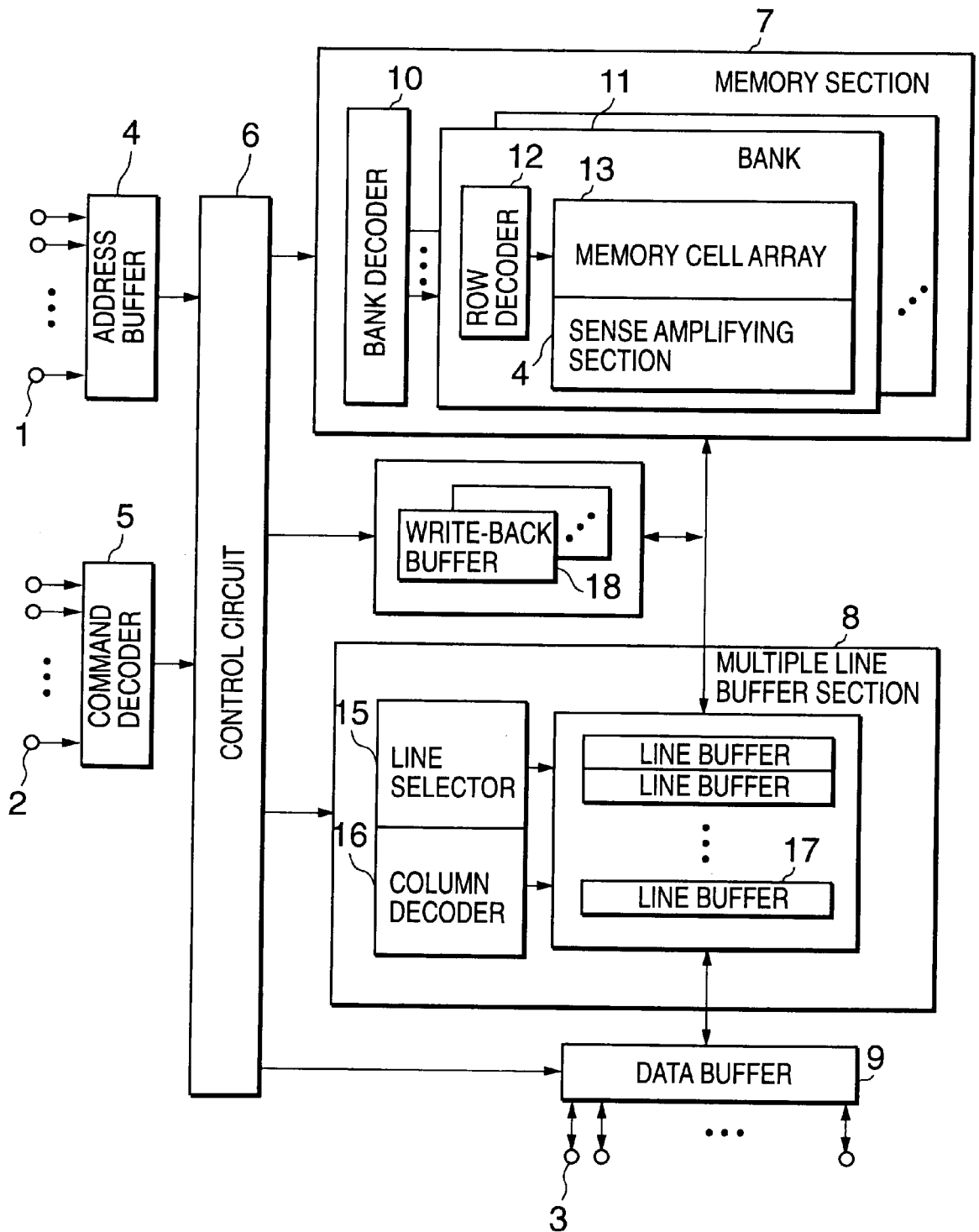
FIG. 3 is a block diagram illustrating a first embodiment of the multiple line buffer type memory LSI of the present invention.

Referring to FIG. 3, description will be hereinafter made for a first embodiment of a multiple line buffer type memory LSI according to this invention.

As illustrated in FIG. 3, this embodiment comprises an address buffer 4, a command decoder 5, a control circuit 6, a memory section 7, a multiple line buffer section 8, a data buffer 9, and one or more write-back buffers (WBB) 18, and has external terminals including an address input terminal group 1, a command input terminal group 2 and a data input/output terminal group 3.

Commands indicating operational contents in this multiple line buffer type memory LSI ,such as, data transfer between the memory section 7 and the multiple line buffer section 8 and data read and write of the multiple line buffer section 8 are entered into the command input terminal group 2, and the entered commands are decoded by the command decoder 5, and entered into the control circuit 6.

Addresses specifying places where data are stored in the multiple line buffer type memory LSI ,such as, a bank address, a row address, a segment address, a column address, a line buffer number and a write-back buffer number are given to the address input terminal group 1, and the given addresses are latched by the address buffer 4, and given into the control circuit 6.

The control circuit 6 controls the memory section 7, the multiple line buffer section 8, the data buffer 9 and the write-back buffer 18 on the basis of the input from the command decoder 5 and the address buffer 4.

The memory section 7 is provided with a bank decoder 10 and one or more banks 11, and each bank 11 comprises a row decoder 12, a memory cell array 13 and a sense amplifying section 14.

Each bank 11 is controlled by the bank decoder 10, and a bank address is an address which selects any one of the banks 11. When data are read out or written in the memory section 7, read and write of data are carried out at the bank 11 specified by a bank address.

The memory cell array 13 is divided into pages (namely, data transfer unit between the memory cell array 13 and the sense amplifying section 14), and the row address is an address for selecting a page in the memory cell array 13.

The row decoder 12 selects a page in the memory cell array 13 based upon the row address, and the sense amplifying section 14 activates (amplifies) and retains the page selected by the row decoder 12.

The multiple line buffer section 8 is composed of a line selector 15, a column decoder 16, and one or more line buffers 17.

Data transfer between the memory section 7, the multiple line buffer section 8 and the write-back buffer 18 is performed in units of segment (a page or a part thereof), and the segment address specifies a segment in the page.

Each line buffer 17 is controlled by the line selector 15, and the line buffer number is an address for selecting any one of the line buffers 17. When read or write of data is conducted in the line buffer section 8, data read or write is performed in the line buffer 17 specified by the line buffer number.

Each line buffer 17 is divided into words (data transfer unit between the multiple line buffer section 8 and the data buffer 9), and the column address specifies a word in the line buffers 17.

The column decoder 16 selects a word in the line buffer 17 on the basis of the column address.

The write-back buffer 18 can retain copies of the data retained in the line buffer 17, and write back the retained data at a desired position in the memory section 7.

When a plurality of write-back buffers 18 are provided, the above-mentioned operations are carried out in the write-back buffer 18 specified by the write-back buffer number.

Commands and address formats in the multiple line buffer type memory LSI shown in FIG. 3 and operations using the same will now be described with reference to FIGS. 4 and 5.

Figure 4:
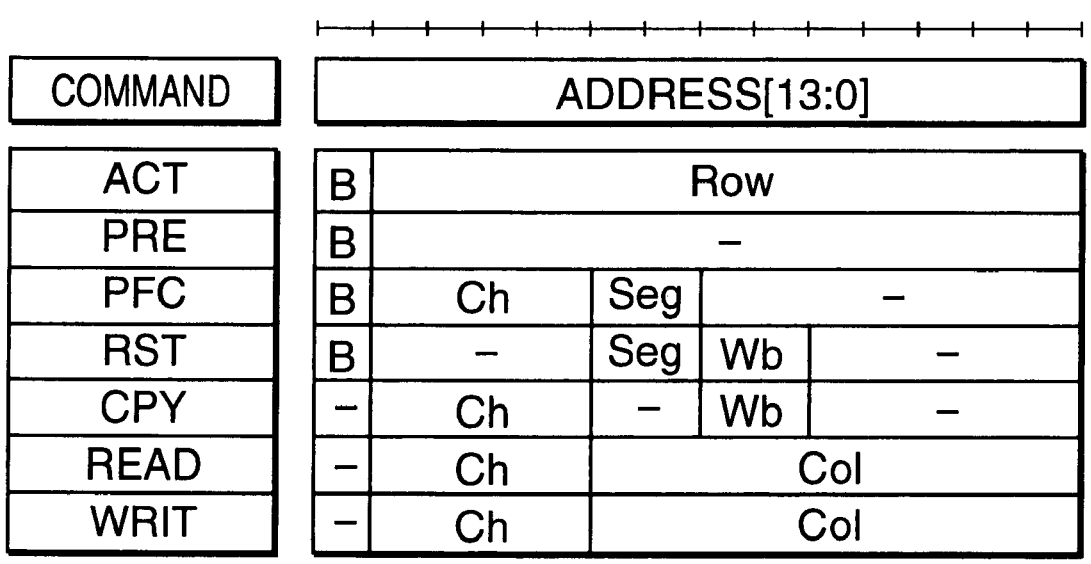
FIG. 4 illustrates a typical list of commands and address formats in the multiple line buffer type memory LSI shown in FIG. 3.

FIG. 4 illustrates a typical list of commands and address formats in the multiple line buffer type memory LSI shown in FIG. 3.

This embodiment is based on the use of the bank activating (ACT) command, the precharging (PRE) command, the prefetching (PFC) command, the restore (RST) command, the copying (CPY) command, the read (READ) command, and the write (WRIT) command. Other assumptions include a total capacity of the memory section 7 of 256 Mbits, a number of banks 11 of 2, a number of line buffers 17 of 16, a number of write-back buffers 18 of 4, and a page size, a segment size and a word size of 8 kbits, 2 kbits and 8 bits, respectively. These commands are entered into the command input terminal group 2.

Addresses necessary for the aforementioned commands including a bank address (B), a row address (Row), a column address (Col), a segment address (Seg), a line buffer number (Ch), and a write-back buffer number (Wb) are entered into the address input terminal group 1 in a format shown in FIG. 4.

Under the bank activating (ACT) command, a page specified by the row address (Row) within a bank 11 specified by the bank address (B) is read out from the memory cell array 13 to the sense amplifying section 14 and retained there.

Under the precharging (PRE) command, a bank 11 specified by the bank address (B) is initialized.

In the prefetching (PFC) command, a segment specified by the segment address (Seg) is read out from the sense amplifying section 14 in the bank 11 specified by the bank address (B), and the read segment is transferred to a line buffer 17 specified by the line buffer number (Ch).

In the restore (RST) command, data of the write-back buffer 18 specified by the write-back buffer number (Wb) are written in the memory cell array 13 via the sense amplifier 14 in the bank 11 specified by the bank address (B) and previously activated under the bank activating (ACT) command. In this event, the segment address (Seg) specifies a segment in the sense amplifying section 14.

Under the copying (CPY) command, data retained by the line buffer 17 specified by the line buffer number (Ch) are copied, and written in the write-back buffer 18 specified by the write-back buffer number (Wb).

In the read (READ) command, words specified by the column address (Col) are read from the line buffer 17 specified by the line buffer No. (Ch) into the data input terminal group 3.

In the write (WRIT) command, word data entered via the data input terminal group 3 are written into a line buffer 17 specified by the line buffer number (Ch) and the column address (Col). Upon this write, the column address (Col) specifies a word of the line buffer 17.

The above-mentioned operations under the individual commands are carried out under control by the control circuit 6.

Figure 1:
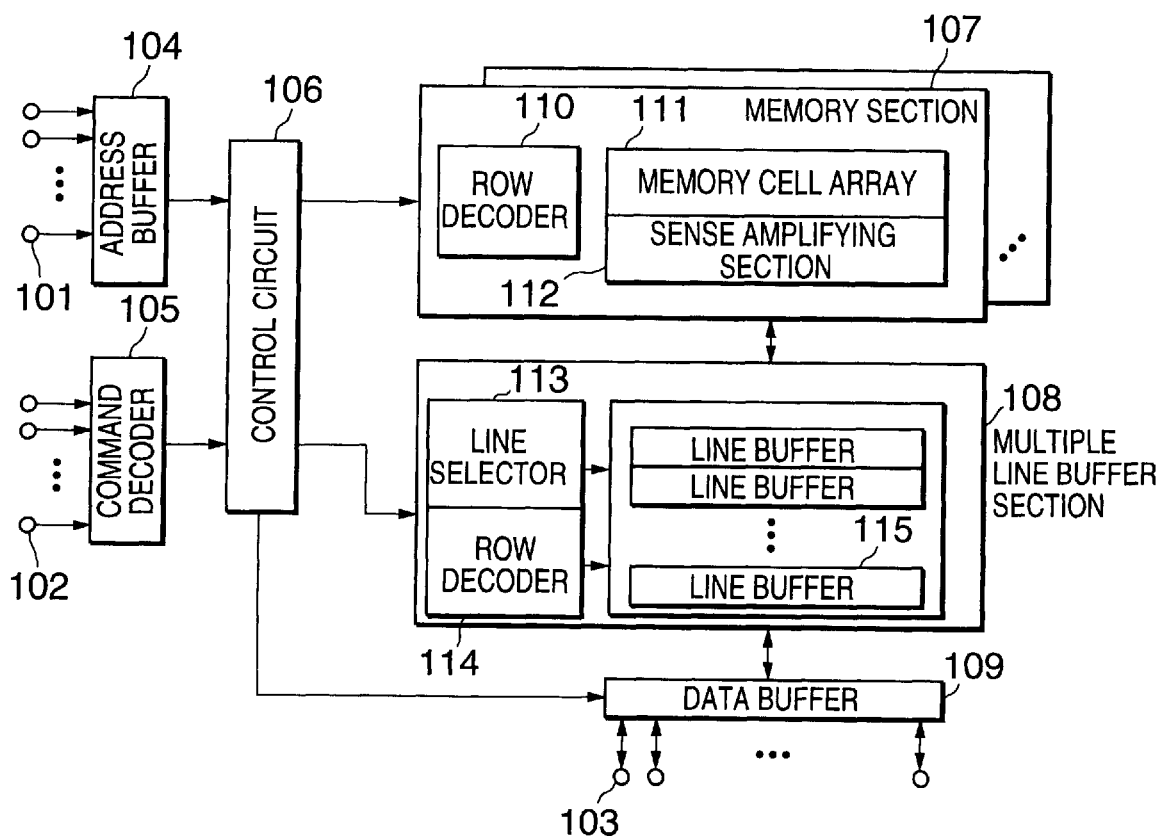
FIG. 1 is a block diagram illustrating a typical configuration of the related line buffer memory LSI.
Figure 2:
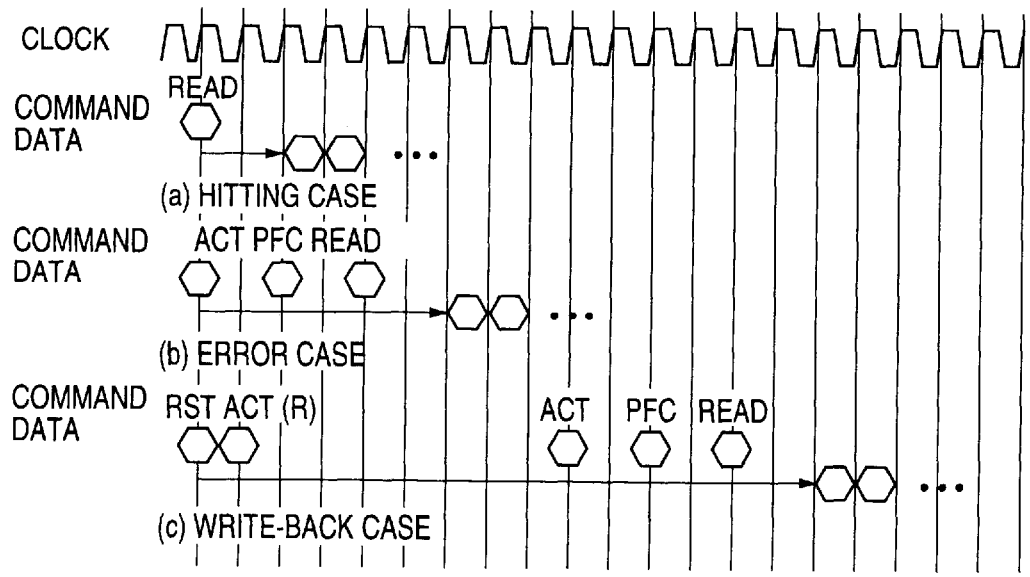
FIG. 2 is a timing chart for explaining a typical data read operation in the related multiple line buffer type memory LSI shown in FIG. 1.
Figure 5:
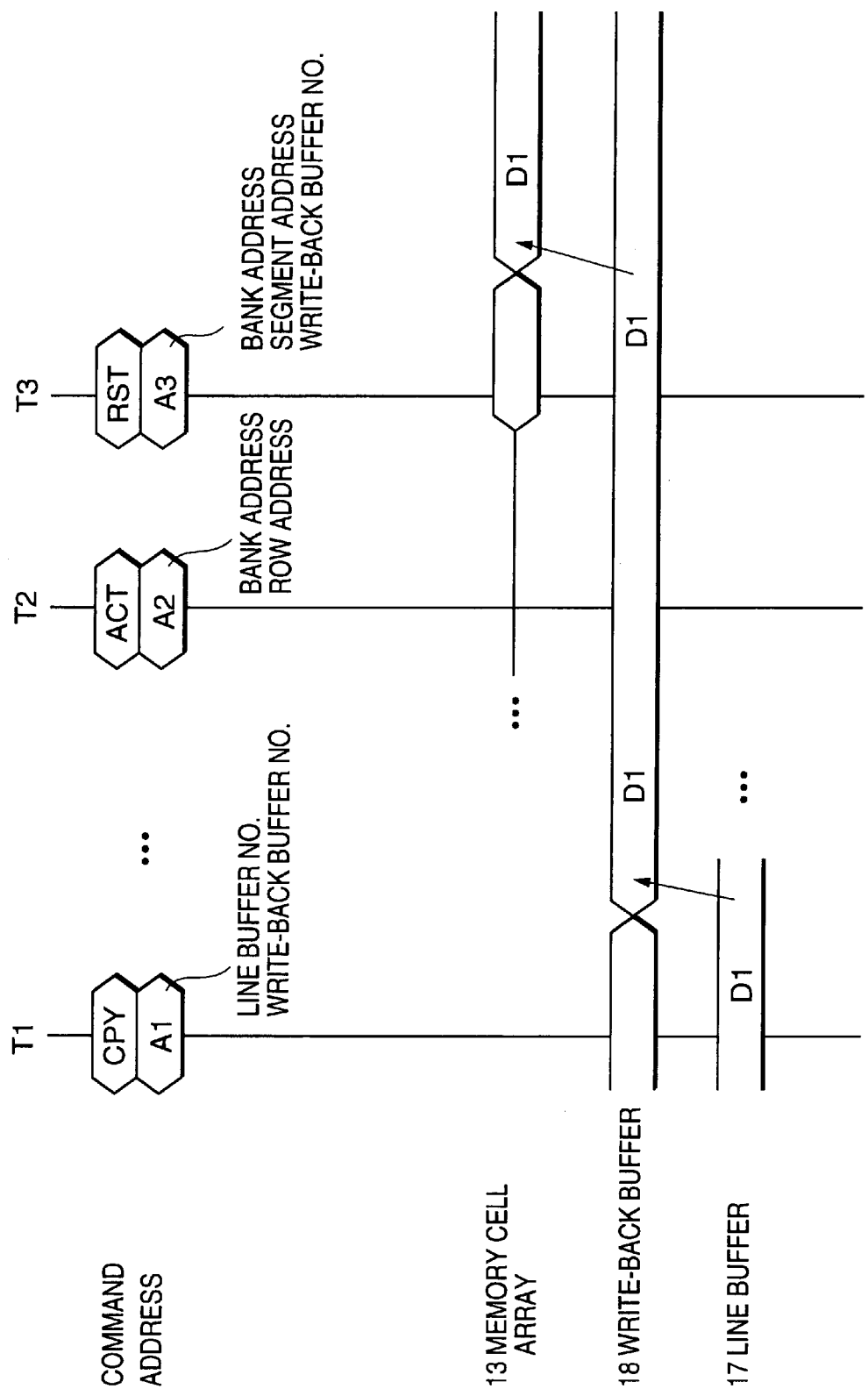
FIG. 5 is a timing chart for explaining a typical data write-back operation from the multiple line buffer section to the memory section in the multiple line buffer type memory LSI shown in FIG. 3.

FIG. 5 is a timing chart for explaining a typical data write-back operation from the multiple line buffer section 8 to the memory section 7 in the multiple line buffer type memory LSI shown in FIG. 1, using the commands and addresses shown in FIG. 4.

First, at time T1, the copying (CPY) command is entered into the command input terminal group 2, and the line buffer number (Ch) and the write-back buffer number (Wb) are entered into the address input terminal group 1.

In the control circuit 6, data of the line buffer 17 selected by the line buffer number (Ch) are copied in accordance with the above-mentioned copying (CPY) command, and transferred and written into the write-back buffer 18 selected by the write-back buffer (Wb).

Next, at time T2, the bank activating (ACT) command is entered into the command input terminal group 2, and the bank address (B) and the row address (Row) are entered into the address input terminal group 1.

In the control circuit 6, a page selected by the row address (Row) in the memory cell array 13 in the bank 11 selected by the bank address (B) is read out and retained into the sense amplifying section 14 as a page into which the data of the write-back buffer 18 are to be written back in compliance with the bank activating (ACT) command.

Then, at time T3, the restore (RST) command is entered into the command input terminal group 2, and the bank address (B), the segment address (Seg) and the write-back buffer (WB) are entered into the address input terminal group 1.

The write-back buffer number (WB) specifies the write-back buffer 18 for data write-back operation to the memory section 7, and the bank address (B) and the segment address (Seg) specify the bank and the segment of the memory section 7, respectively.

In the control circuit 6, under the restore (RST) command, the data temporarily retained in the write-back buffer 18 are written back to the memory section 7 via the sense amplifying section 14.

Data transfer from the line buffer 17 to the write-back buffer 18 can be carried out at a high speed as compared with data transfer from the line buffer 17 to the memory section 7. Further, it is possible to conduct data write-back operation at any time to the memory section 7 unless the data of the write-back buffer 18 are rewritten.

As a result, after copying and temporarily retaining the data of the line buffer 17 in the write-back buffer 18, it is possible to immediately execute an access to the line buffer 17. This permits reduction of delays in memory access caused by data write-back operation.

Second Embodiment

Figures 6, 7:
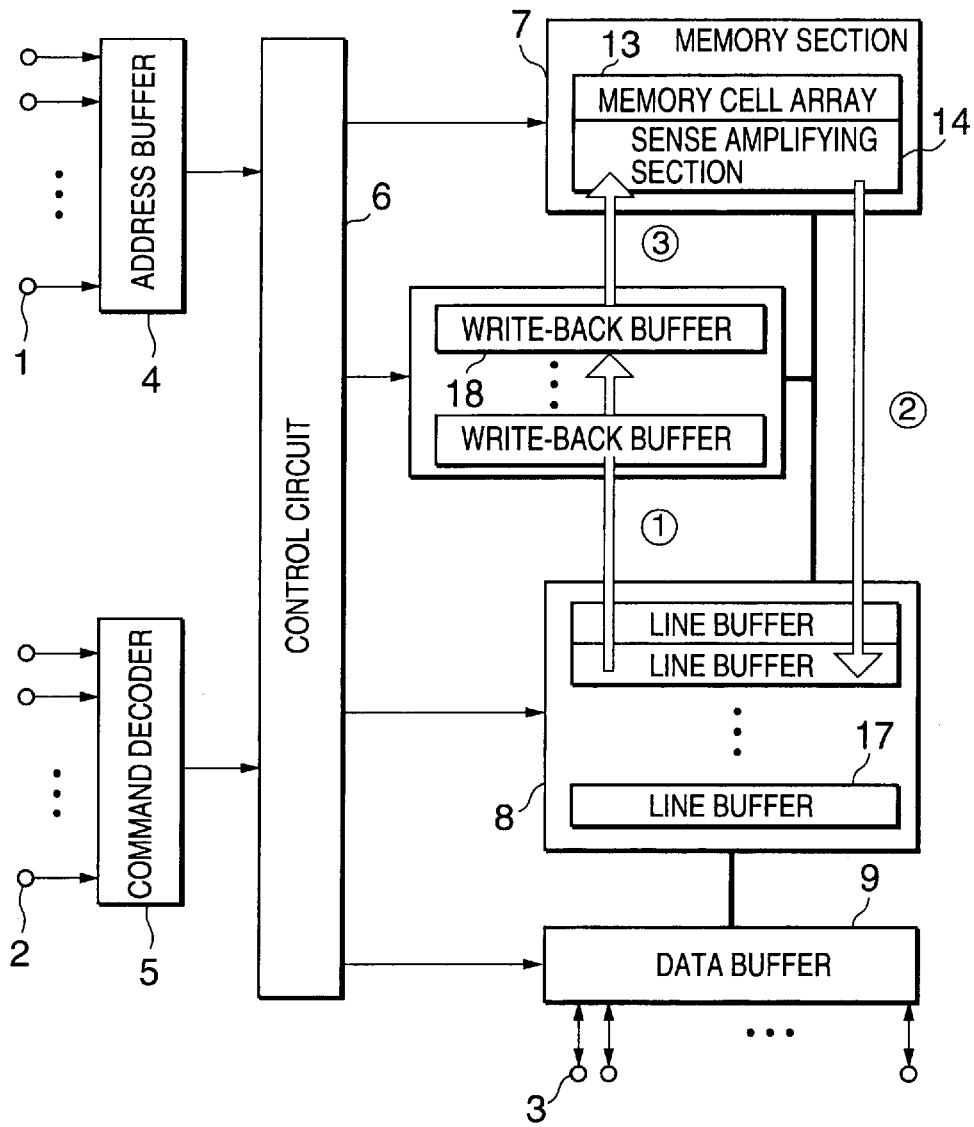
FIG. 6 is a block diagram illustrating a second embodiment of the multiple line buffer type memory LSI of the invention.
FIG. 7 illustrates a typical list of commands and address formats in the multiple line buffer type memory LSI shown in FIG. 4.

Referring to FIG. 6, description will be made about a second embodiment of a multiple line buffer type memory LSI according to a second embodiment.

In FIG. 6, the flow of data upon writing back data from the line buffer 17 to the memory section 7 is shown by arrows (1), (2) and (3). As illustrated in FIG. 6, the bank decoder 10, the row decoder 12, the line selector 15 and the column decoder 16 shown in FIG. 3 will be omitted to simplify illustration.

In this embodiment, data write-back operation from the line buffer 17 to the memory section 7 is performed upon data transfer from the memory section 7 to the line buffer 17. More specifically, this operation will be explained as follows.

When the command and address to instruct data transfer from the memory section 7 to the line buffer 17 are entered into the command input terminal group 2 and the address input terminal group 1, data in the line buffer 17 which is to store the data read out from the memory section 7 are first copied and written in the write-back buffer 18 (arrow (1)).

Then, the data read out from the memory section 7 are written into the line buffer 17 (arrow (2)).

When it is necessary to write back data from the write-back buffer 18 to the memory section 7 (for example, when data retained in the memory section 7 and the write-back buffer 18 do not agree with each other), data write-back from the write-back buffer 18 to the memory section 7 is carried out prior to rewriting again the write-back buffer 18 (arrow (3)).

The commands and addresses in the multiple line buffer type memory LSI shown in FIG. 4 and operations by use thereof will now be described with reference to FIGS. 7 and 8. FIG. 7 illustrates a typical list of commands and address formats in the multiple line buffer type memory LSI shown in FIG. 4.

This embodiment is based on the use of four commands including the bank activating (APFCA) command, the restore (ARSTA) command, the read (READ) command and the write (WRIT) command. Other assumptions include a total capacity of the memory section 7 of 256 Mbits, a number of banks 11 of 2, a number of line buffers 17 of 16, a number of write-back buffers 18 of 4, and a page size, a segment size and a word size of 8 kbits, 2 kbits and 8 bits, respectively. These commands are entered into the command input terminal groups 2.

Addresses necessary for the aforementioned commands including a bank address (B), a row address (Row), a column address (Col), a segment address (Seg), a line buffer number (Ch), and a write-back buffer number (Wb) are entered into the address input terminal group 1 in a format shown in FIG. 5.

Under the bank activating (APFCA) command, a bank 11 specified by the bank address (B) is first activated (the page of the memory cell array 13 specified by the row address (Row) is retained by the sense amplifying section 14), and simultaneously, the data of the line buffer 17 specified by the line buffer number (Ch) are copied and written into the write-back buffer 18 specified by the write-back buffer number (Wb). Subsequently, the segment specified by the segment address (Seg) is transferred from the activated page to the line buffer 17 specified by the line buffer No. (Ch). Finally, the activated bank 11 is initialized.

Under the restore (ARSTA) command, the bank 11 specified by the bank address (B) is first activated. Next, the data of the write-back buffer 18 specified by the write-back buffer number (Wb) are written into the segment specified by the segment address (Seg) of the page of the activated bank 11, and the thus activated bank 11 is initialized.

Under the read (READ) command, words specified by the row address (Row) are read out from the line buffer 17 specified by the line buffer No. (Ch) into the data input terminal group 3.

Under the write (WRIT) command, word data entered via the data input terminal group 3 are written into the line buffer 17 specified by the line buffer No. (Ch). Upon this write, the row address (Row) specifies a word of the line buffer 17.

The above-mentioned operations under the individual commands are carried out under control by the control circuit 6.

Figure 8:
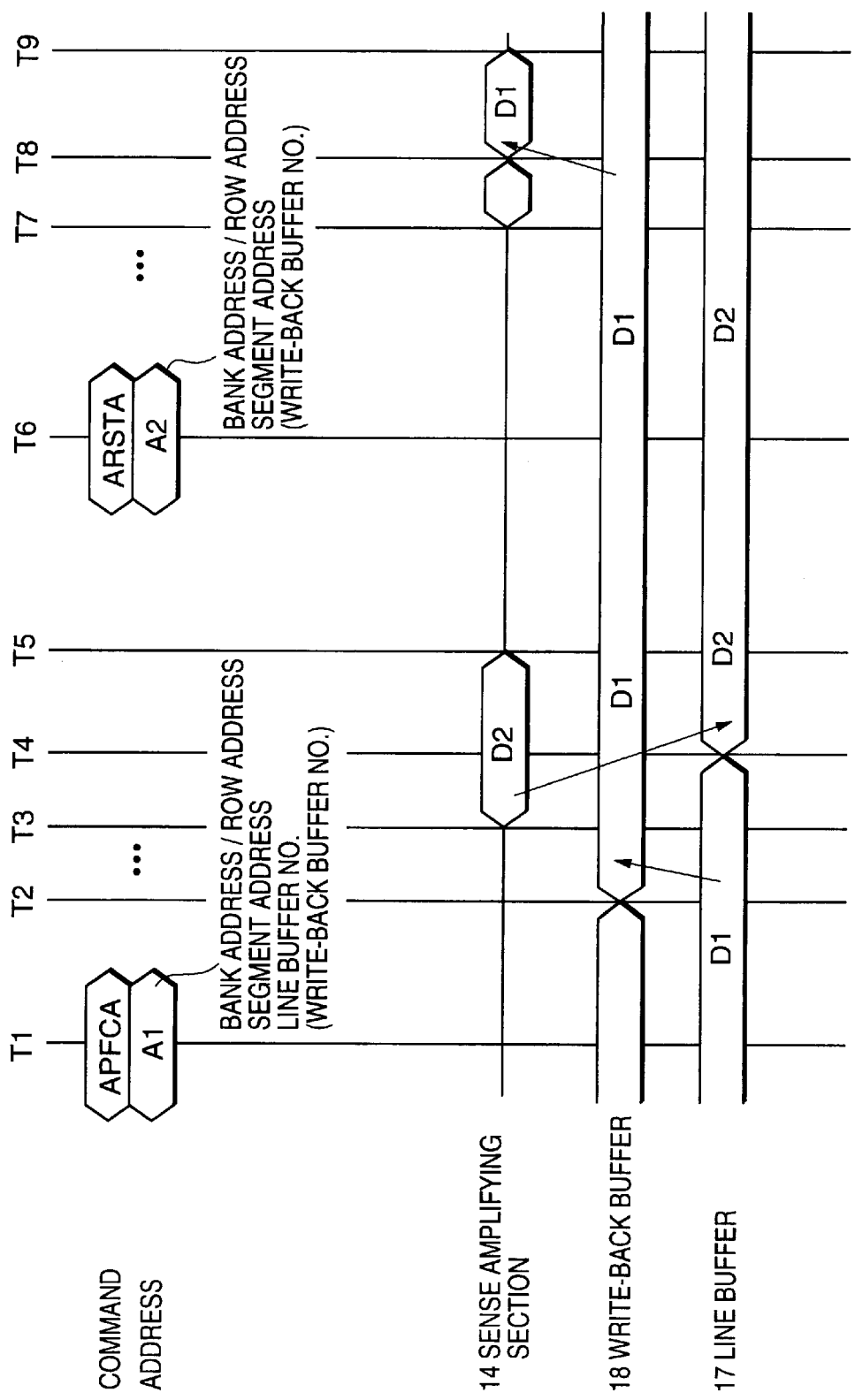
FIG. 8 is a timing chart for explaining a typical data write-back operation from the multiple line buffer section to the memory section in the multiple line buffer type memory LSI shown in FIG. 4.

FIG. 8 is a timing chart for explaining a typical data write-back operation from the multiple line buffer section 8 to the memory section 7 in the multiple line buffer type memory LSI shown in FIG. 6, using the commands and addresses shown in FIG. 7.

First, at time T1, the bank activating (APFCA) command is entered into the command input terminal group 2, and the bank address (B), the row address (Row), the column address (Col), the segment address (Seg), the line buffer number (Ch), and the write-back buffer number (Wb) are entered into the address input terminal group 1.

In the control circuit 6, under the bank activating (APFCA) command, the page in the memory cell array 13 specified by the bank address (B) and the row address (Row) is read out into the sense amplifying section 14 and retained there (sense amplifier activation) during the period of time T1 through the time T3. While the sense amplifying section 14 is activated, at time T2, the data in the line buffer 17 specified by the line buffer number (Ch) are copied and retained in the write-back buffer 18 specified by the write-back buffer number (Wb). At time T4, the segment specified by the segment address (Seg) is read out from the sense amplifying section 14 and written into the line buffer 17 specified by the line buffer number (Ch). At time T5, the activated bank 11 is initialized.

Write-back of the data temporarily in standby in the write-back buffer 18 into the memory cell array 13 is accomplished by the restore (ARSTA) command.

Then, at time T6, the restore (ARSTA) command is entered into the command input terminal group 2, and the bank address (B), the row address (Row), the segment address (Seg), and the write-back buffer number (Wb) are entered into the address input terminal group 1.

In the control circuit 6, under the restore (ARSTA) command, the page in the memory section 7 specified by the bank address (B) and the row address (Row) is read out into the sense amplifying section 14 during the period of time T6 through time T7. At time T8, the data in the write-back buffer 18 specified by the write-back buffer number (Wb) are written into the segment specified by the segment address (Seg) of the activated bank 11. At time T9, the activated bank 11 is initialized.

Data transfer between the memory section 7 and the line buffer 17 is generally at a low speed. In the related art 1 not using a write-back buffer 18 shown in FIG. 22, it is necessary to write back data of the line buffer 17 into the memory section prior to reading out the data from the memory section 7 into the line buffer 17.

In the present invention, in contrast, it is possible to read out the data from the memory section 7 into the line buffer 17 without waiting for write-back of the data of the line buffer 17 into the memory section 7 by temporarily putting the data of the line buffer 17 in standby in the write-back buffer 18. This permits achievement of a higher speed of read (a shorter latency).

Another examples of commands and addresses and operations using the same in the multiple line buffer type memory LSI shown in FIG. 4 will now be described with reference to FIGS. 9 and 10.

Figure 9:
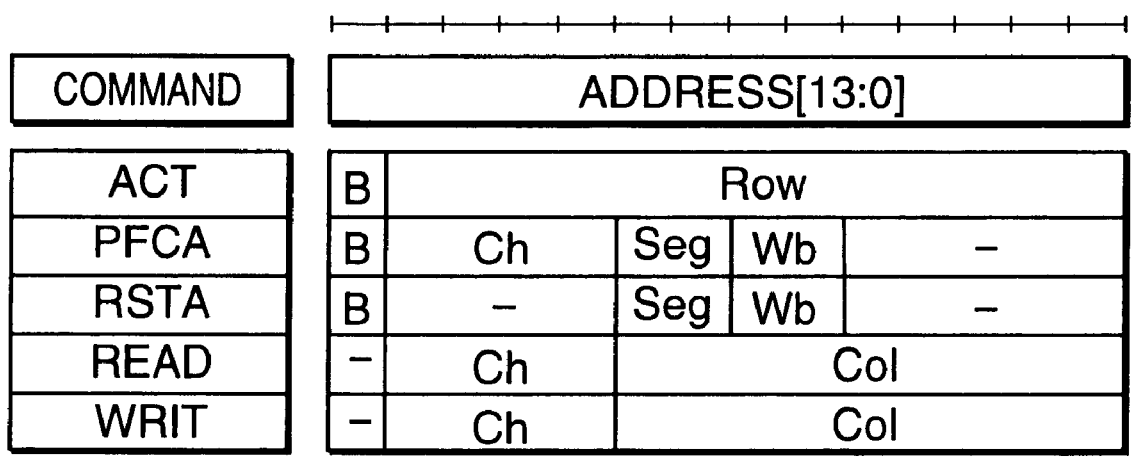
FIG. 9 illustrates another typical list of commands and address formats in the multiple line buffer type memory LSI shown in FIG. 4.

FIG. 9 illustrates another typical list of commands and address formats in the multiple line buffer type memory LSI shown in FIG. 6.

This embodiment is based on the use of five commands including the bank activating (ACT) command, the prefetching (PFCA) command, the restore (RSTA) command, the read (READ) command and the write (WRIT) command. Other assumptions include a total capacity of the memory section 7 of 256 Mbits, a number of banks 11 of 2, a number of line buffers 17 of 16, a number of write-back buffers 18 of 4, and a page size, a segment size and a word size of 8 kbits, 2 kbits and 8 bits, respectively. These commands are entered into the command input terminal group 2.

Addresses necessary for the aforementioned five commands including the bank address (B), the row address (Row), the column address (Col), the segment address (Seg), the line buffer number (Ch), and the write-back buffer number (Wb) are entered into the address input terminal group 1 in formats shown in FIG. 9.

Under the bank activating (ACT) command, a bank 11 specified by the bank address (B) is activated (the page of the memory cell array 13 specified by the row address (Row) is retained by the sense amplifying section 14).

Under the prefetching (PFCA) command, the data of the line buffer 17 specified by the line buffer No. (Ch) are first copied and written into the write-back buffer 18 specified by the write-back buffer number (Wb). Then, the segment specified by the segment address (Seg) is transferred from the bank 11 specified by the bank address (B) and previously activated to the line buffer 17 specified by the line buffer number (Ch). Finally, the bank 11 specified by the bank address (B) is initialized.

Under the restore (RSTA) command, the data of the write-back buffer 18 specified by the write-back buffer number (Wb) are first written into the bank specified by the bank address (B) and previously activated. Next, the bank 11 specified by the bank address (B) is initialized.

Under the read (READ) command, the data specified by the row address (Row) are read out from the line buffer 17 specified by the line buffer number (Ch) into the data input terminal group 3.

Under the write (WRIT) command, the word data entered via the data input terminal group 3 are written into the line buffer 17 specified by the line buffer No. (Ch). The segment address (Seg) specifies a segment of the line buffer 17.

The operations under the above-mentioned commands are carried out under control by the control circuit 6.

Figure 10:
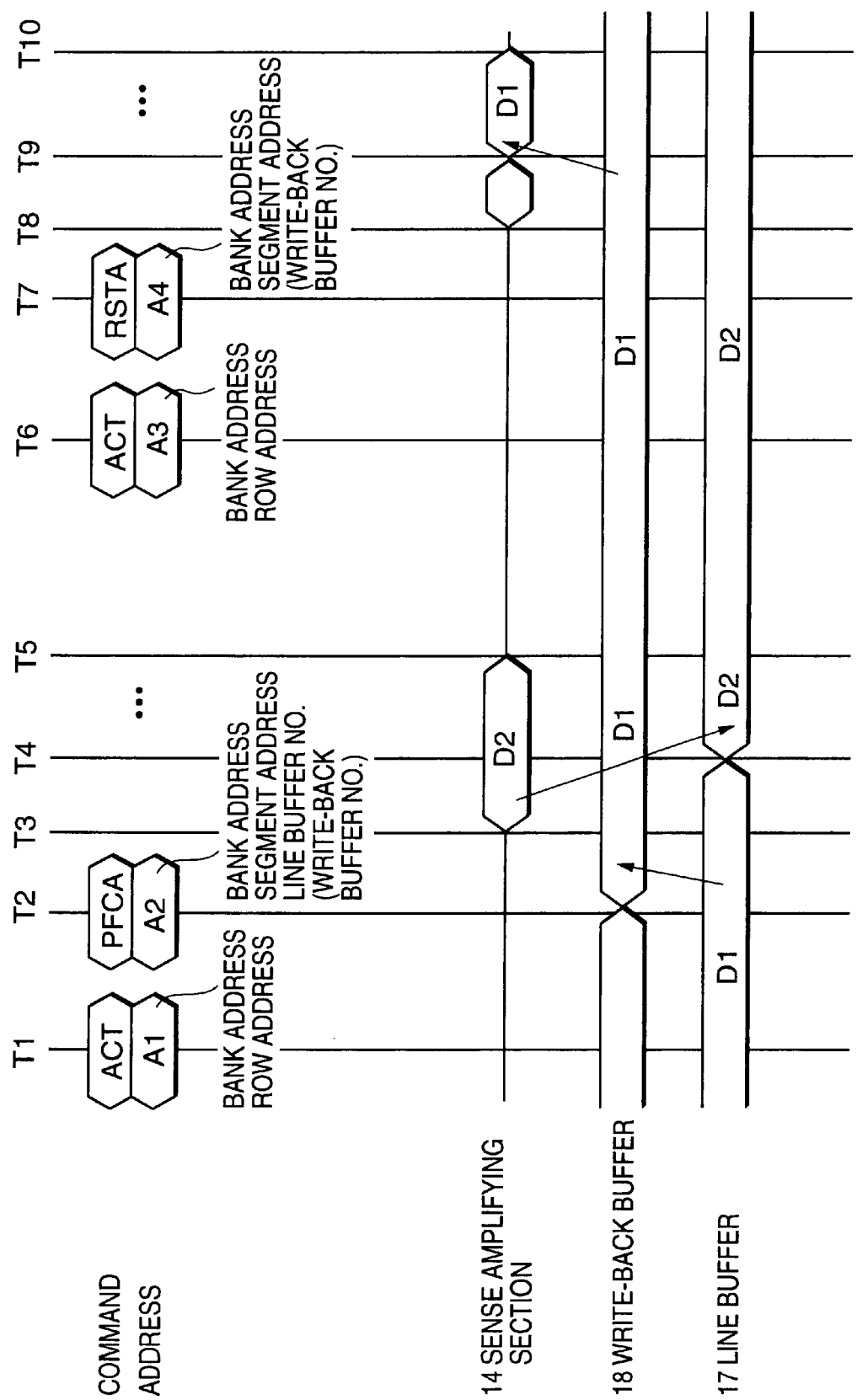
FIG. 10 is a timing chart for explaining another typical data write-back operation from the multiple line buffer section to the memory section in the multiple line buffer type memory LSI shown in FIG. 4.

FIG. 10 is a timing chart for explaining another typical data write-back operation from the multiple line buffer section 8 into the memory section 7 in the multiple line buffer type memory LSI shown in FIG. 6, using the commands and addresses shown in FIG. 9.

At time T1, the bank activating (ACT) command is entered into the command input terminal group 2, and the bank address (B) and the row address (Row) are entered into the address input terminal group 1.

In the control circuit 6, under the above-mentioned bank activating (ACT) command, the page in the memory cell array 13 specified by the bank address (B) and the row address (Row) is read out into the sense amplifying section 14, during a period of time T1 through time T3.

Then, at time T2, the prefetching (PFCA) command is entered into the command input terminal group 2, and the bank address (B), the segment address (Seg), and line buffer number (Ch) and the write-back buffer number (Wb) are entered into the address input terminal group 1.

In the control circuit 6, under the above-mentioned prefetching (PFCA) command, the data in the line buffer 17 specified by the line buffer number (Ch) are copied and retained in the write-back buffer 18. At time T4, the segment specified by the segment address (Seg) is written from the sense amplifying section 14 to the line buffer 17 specified by the line buffer number (Ch). At time T5, the bank 11 specified by the bank address (B) is initialized.

In this case, the data temporarily held in standby in the write-back buffer 18 are written back to the memory cell array 13 under the restore (RSTA) command.

Then, at time T6, the bank activating (ACT) command is entered into the command input terminal group 2, and the bank address (B) and the row address (Row) are entered into the address input terminal group 1.

In the control circuit 6, under the above-mentioned bank activating (ACT) command, the page in the memory cell array 13 specified by the bank address (B) and the row address (Row) is read out into the sense amplifying section 14 during a period of time T8 through time T9.

Subsequently, at time T7, the restore (RSTA) command is entered into the command input terminal group 2, and the bank address (B), the segment address (Seg) and the write-back buffer number (Wb) are entered into the address input terminal group 1.

In the control circuit 6, under the above-mentioned restore (RSTA) command, at time T9, the data in the write-back buffer 18 specified by the write-back buffer number (Wb) are written back to the bank 11 specified by the bank address (B) and previously activated. At time T10, the bank 11 specified by the bank address (B) is initialized.

In the examples shown in FIGS. 9 and 10, as described above, the number of addresses entered at a time is reduced by dividing the command. It is therefore possible to reduce the number of input terminals of the address input terminal group 1.

Third Embodiment

Figures 11, 12:
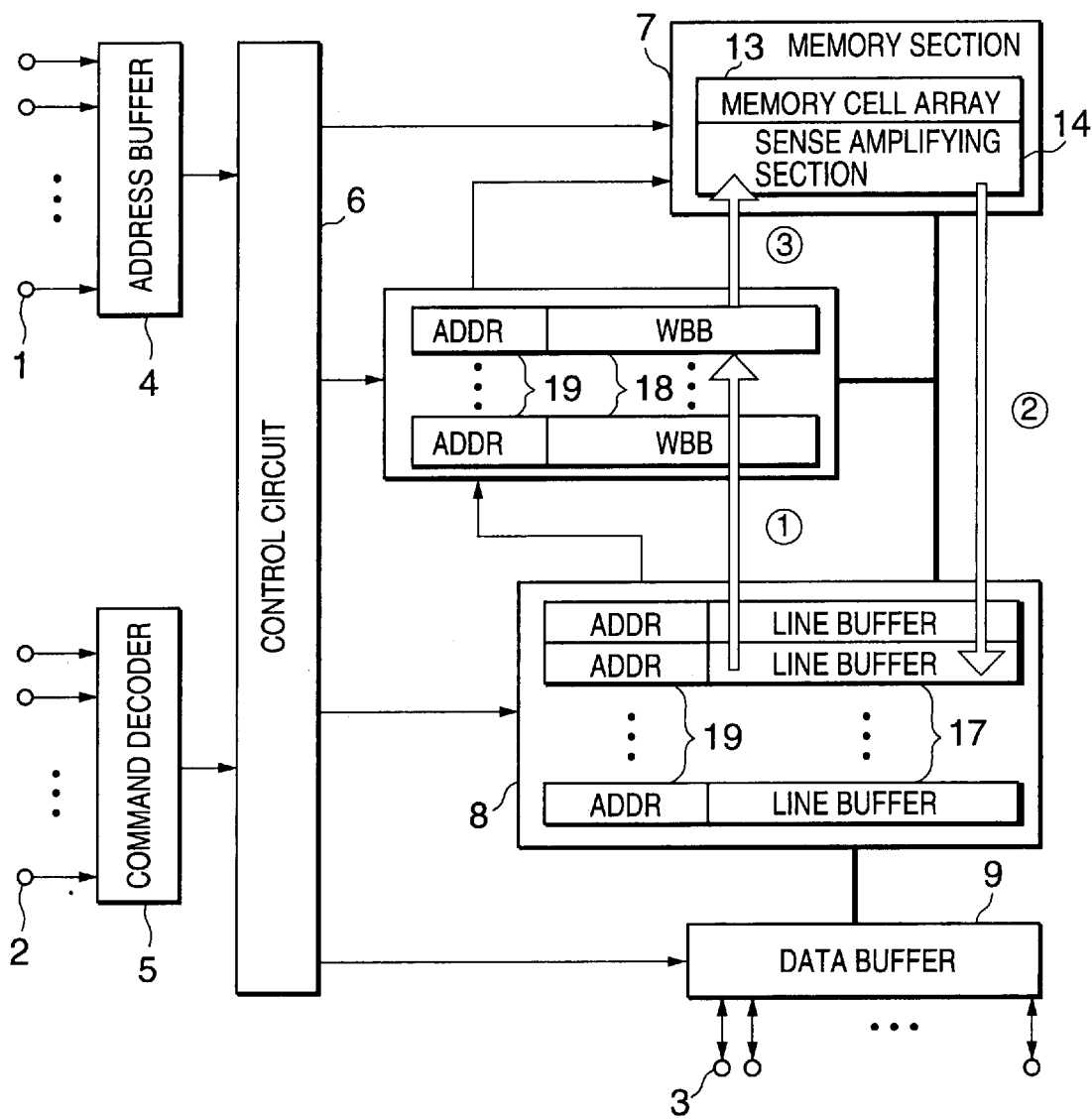
FIG. 11 is a block diagram illustrating a third embodiment of the multiple line buffer type memory LSI of the invention.
FIG. 12 illustrates a typical list of commands and address formats in the multiple line buffer type memory LSI shown in FIG. 11.

Referring to FIG. 11, description will be made about a third embodiment of a multiple line buffer type memory LSI according to this invention.

As illustrated in FIG. 11, this embodiment is the same as the multiple line buffer type memory LSI shown in FIG. 6, except for the addition of an address tag (ADDR) 19 for retaining the addresses of the memory section 7 to the line buffer 17 and the write-back buffers 18.

When the data read out from the memory section 7 are retained in the line buffer 17, the addresses used in the read operation (the bank address, the row address and the segment address) are written into the address tag 19 added to the line buffer 17.

When the copies of data of the line buffer 17 are temporarily retained in the write-back buffer 18, on the other hand, the addresses retained in the address tag 19 added to the line buffer 17 are written in the address tag 19 added to the write-back buffer 18. When writing back the data temporarily retained in the write-back buffer 18 into the memory section 7, the addresses retained in the address tag 19 of the write-back buffer 18 are used.

The commands and addresses and the operations using the same of the multiple line buffer type memory LSI shown in FIG. 11 will now be described with reference to FIGS. 12 and 13.

FIG. 12 illustrates a typical list of commands and address formats in the multiple line buffer type memory LSI shown in FIG. 11.

This embodiment is based on the use of five commands including the bank activating (ACT) command, the prefetching (PFCA) command, the restore (RSTA) command, the read (READ) command, and the write (WRIT) command. Other conditions include a total capacity of the memory section 7 of 256 Mbits, a number of banks 11 of 2, a number of line buffers 17 of 16, a number of write-back buffers 18 of 4, and a page size, a segment size and a word size of 8 kbits, 2 kbits and 8 bits, respectively. These commands are entered into the command input terminal group 2.

Addresses necessary for these commands including the bank address (B), the row address (Row), the column address (Col), the segment address (Seg), the line buffer number (Ch), and the write-back buffer number (Wb) are entered into the address input terminal group 1 in the format shown in FIG. 10.

Under the bank activating (ACT) command, the bank specified by the bank address (B) is activated. Namely, the page of the memory cell array 13 specified by the row address (Row) is retained in the sense amplifying section 14.

Under the prefetching (PFCA) command, the data of the line buffer 17 specified by the line buffer number (Ch) and the address tag 19 are copied into the write-back buffer 18 specified by the write-back buffer number (Wb). Then, the segment address (Seg) is transferred from the page of the bank 11 specified by the bank address (B) and previously activated to the line buffer 17 specified by the line buffer number (Ch). Next, the bank address (B) and the row address (Row) entered together with the bank activating (ACT) command, and the segment address (Seg) entered together with the prefetching (PFCA) command are written in the address tag 19 of the line buffer 17. Finally, the bank 11 specified by the bank address (B) is initialized.

Under the restore (RSTA) command, the data of the write-back buffer 18 specified by the write-back buffer number (Wb) are written back by activating the memory section 7 by the use of the addresses retained in the address tag 19 of that write-back buffer 18. Finally, the activated bank 11 is initialized.

Under the read (READ) command, the word specified by the row address (Row) is read out from the line buffer 17 specified by the line buffer number (Ch) into the data input terminal group 3.

Under the write (WRIT) command, the word data entered via the data input terminal group 3 are written in the line buffer 17 specified by the line buffer number (Ch). The segment address (Seg) specifies the word of the line buffer 17.

The operations under the above-mentioned commands are carried out under control by the control circuit 6.

Figure 13:
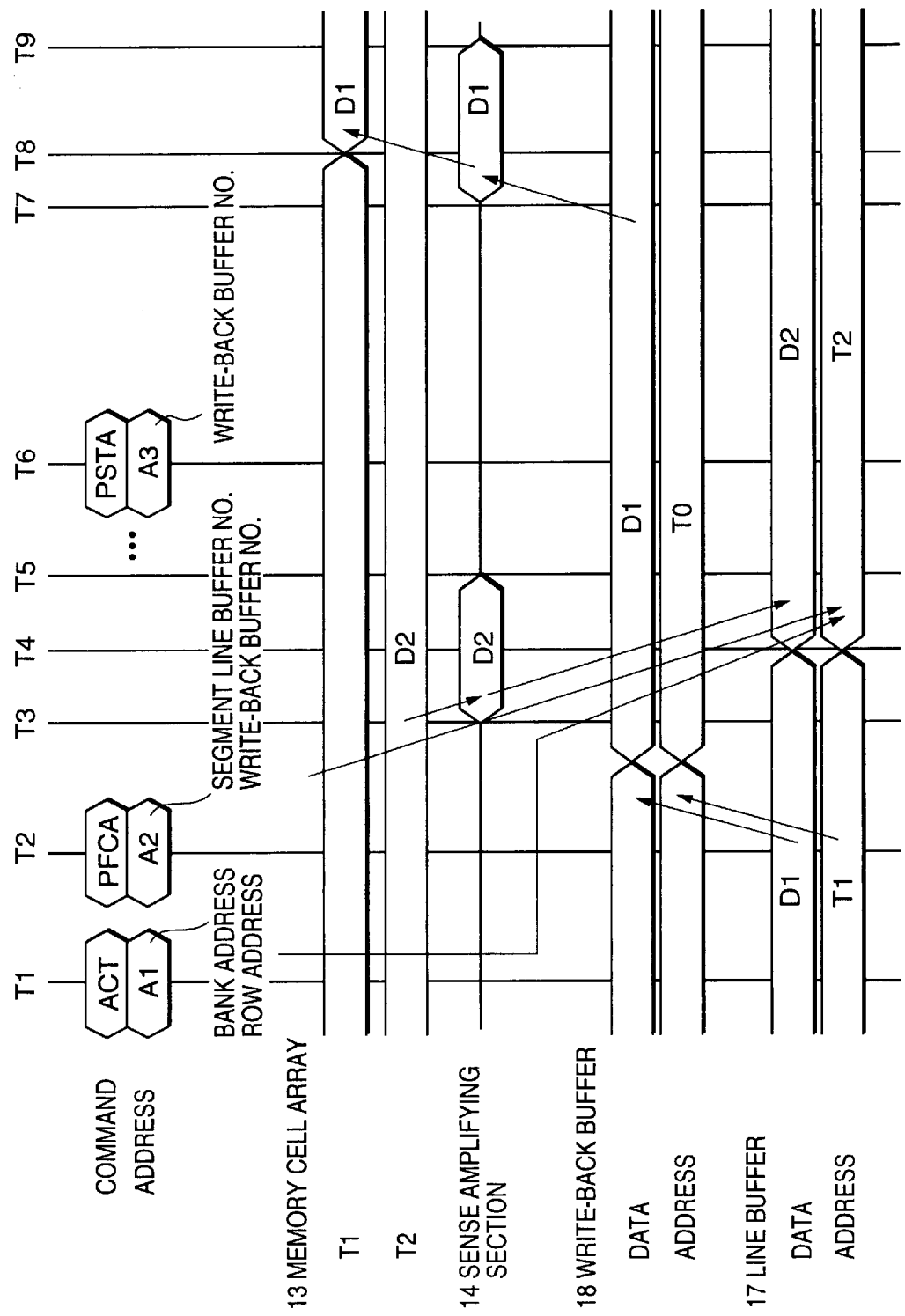
FIG. 13 is a timing chart for explaining a typical data write-back operation from the multiple line buffer section to the memory section in the multiple line buffer type memory LSI shown in FIG. 11.

FIG. 13 is a timing chart for explaining a typical data write-back operation from the multiple line buffer section 8 to the memory section 7 in the multiple line buffer type memory LSI shown in FIG. 9, using the commands and addresses shown in FIG. 12.

At time T1, the bank activating (ACT) command is entered into the command input terminal group 2, and the bank address (B) and the row address (Row) are entered into the address input terminal group 1.

In the control circuit 6, under the above-mentioned bank activating (ACT) command, the page in the memory cell array 13 specified by the bank address (B) and the row address (Row) is read out into the sense amplifying section 14 during a period of time T1 through time T3.

Then, at time T2, the prefetching (PFCA) command is entered into the command input terminal group 2, and the bank address (B), the segment address (Seg), the line buffer number (Ch), and the write-back number (Wb) are entered into the address input terminal group 1.

In the control circuit 6, under the above-mentioned prefetching (PFCA) command, the data of the line buffer 17 specified by the line buffer number (Ch) and the address tag are copied into the write-back buffer 18 specified by the write-back buffer (Wb). At time T4, the segment specified by the segment address (Seg) is written in the line buffer 17 specified by the line buffer No. (Ch). Simultaneously with this, the bank address (B) and the row address (Row) entered together with the bank activating (ACT) command at time T1 and the segment address (Seg) entered together with the prefetching (PFCA) command at time T2 are written in the address tag 19 of the line buffer 17 specified by the line buffer number (Ch). At time T5, the bank 11 specified by the bank address (B) is initialized.

Write-back of the data held temporarily in standby in the write-back buffer 18 to the memory cell array 13 is accomplished under the restore (RSTA) command.

Then, at time T6, the restore (RSTA) command is entered into the command input terminal group 2, and the write-back buffer number (Wb) is entered into the address input terminal group 1. Under this restore (RSTA) command, the bank address (B), the row address (Row) and the segment address (Seg) retained by the address tag 19 of the write-back buffer 18 specified by the write-back buffer (Wb) are used for activating the memory section 7.

In the control circuit 6, under the above-mentioned restore (RSTA) command, the page in the memory cell array 13 specified by the address tag 19 is read out in the sense amplifying section 14 during a period of time T6 through time T7. At time T7, the data of the write-back buffer 18 specified by the write-back buffer number (Wb) are written back to the segment specified by the segment address (Seg) of the activated bank 11. At time T9, the bank 11 specified by the bank address (B) is initialized.

In this embodiment, as described above, it is not necessary to perform address control for write-back operation from the write-back buffer 18 to the memory section 7 by an external controller by using an address tag 19. It is therefore possible to simplify the external controller, and reduce the number of terminals of the address input terminal group 1 of this multiple line buffer type memory LSI.

Fourth Embodiment

Figure 14:
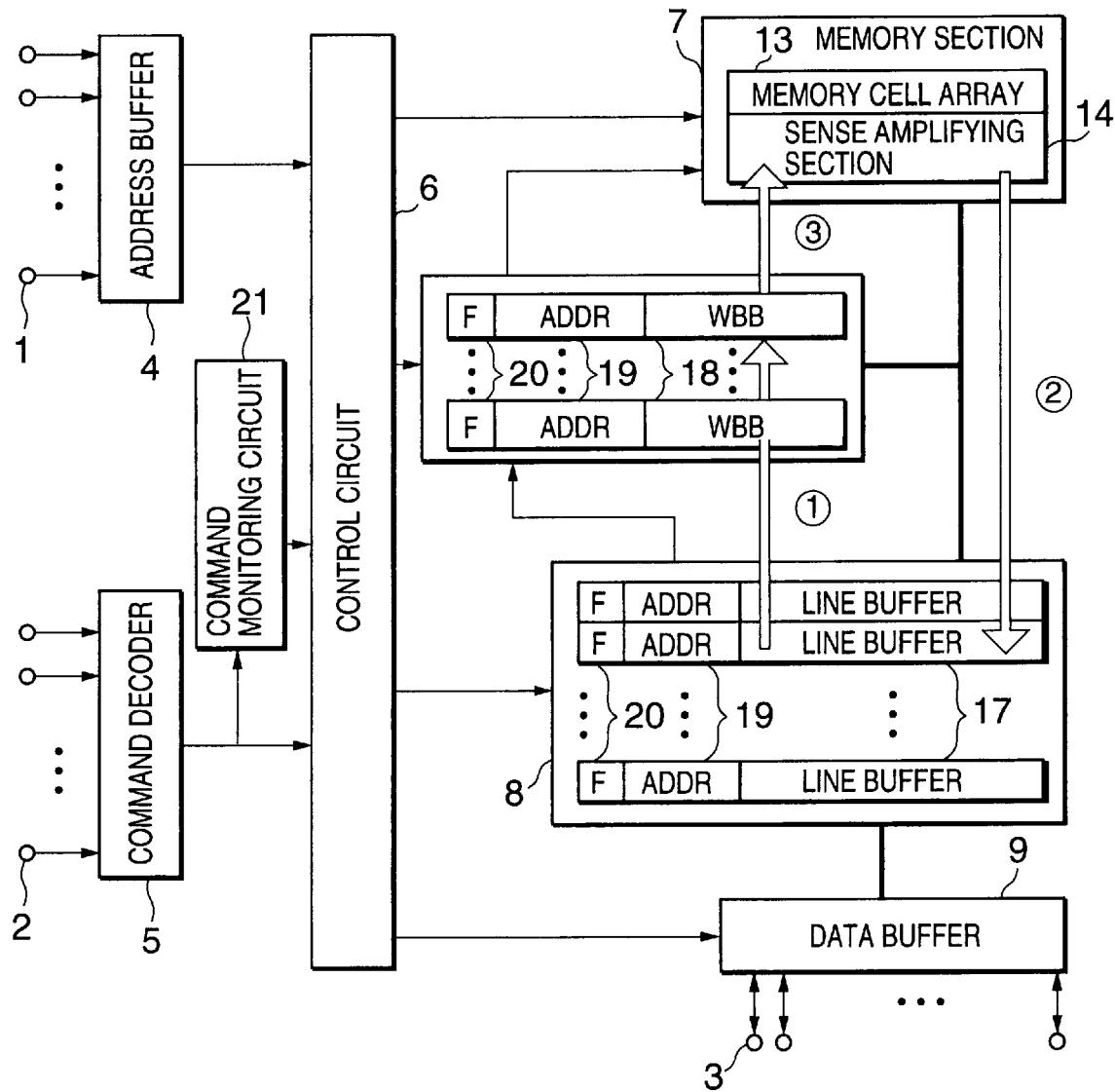
FIG. 14 is a block diagram illustrating a fourth embodiment of the multiple line buffer type memory LSI of the invention.

Referring to FIG. 14, description will be made about a fourth embodiment of a multiple line buffer type memory LSI according to this invention.

As illustrated in FIG. 14, this embodiment is the same as the multiple line buffer type memory LSI shown in FIG. 11 except that a command monitoring circuit 21 for detecting non-input of a command from the command input terminal group 2 for a certain period of time, and a flag (F) 20 added to each of the line buffers 17 and the write-back buffers 18 are provided.

The flag 20 added to each of the line buffers 17 and the write-back buffers 18 indicates the necessity to write back data to the memory section 7, and is updated from time to time by operating the line buffers 17 and the write-back buffers 18.

The command monitoring circuit 21 monitors commands entered into the command input terminal group 2, and detects whether or not a command is entered for a certain period of time.

For example, when it is detected that a write-back buffer 18 requiring write-back is present on the basis of the state of the flag 20, and that there is no command input for a certain period of time according to the command monitoring circuit 21, the control circuit 6 automatically starts write-back from the write-back buffer 18 to the memory section 7.

Figure 15:
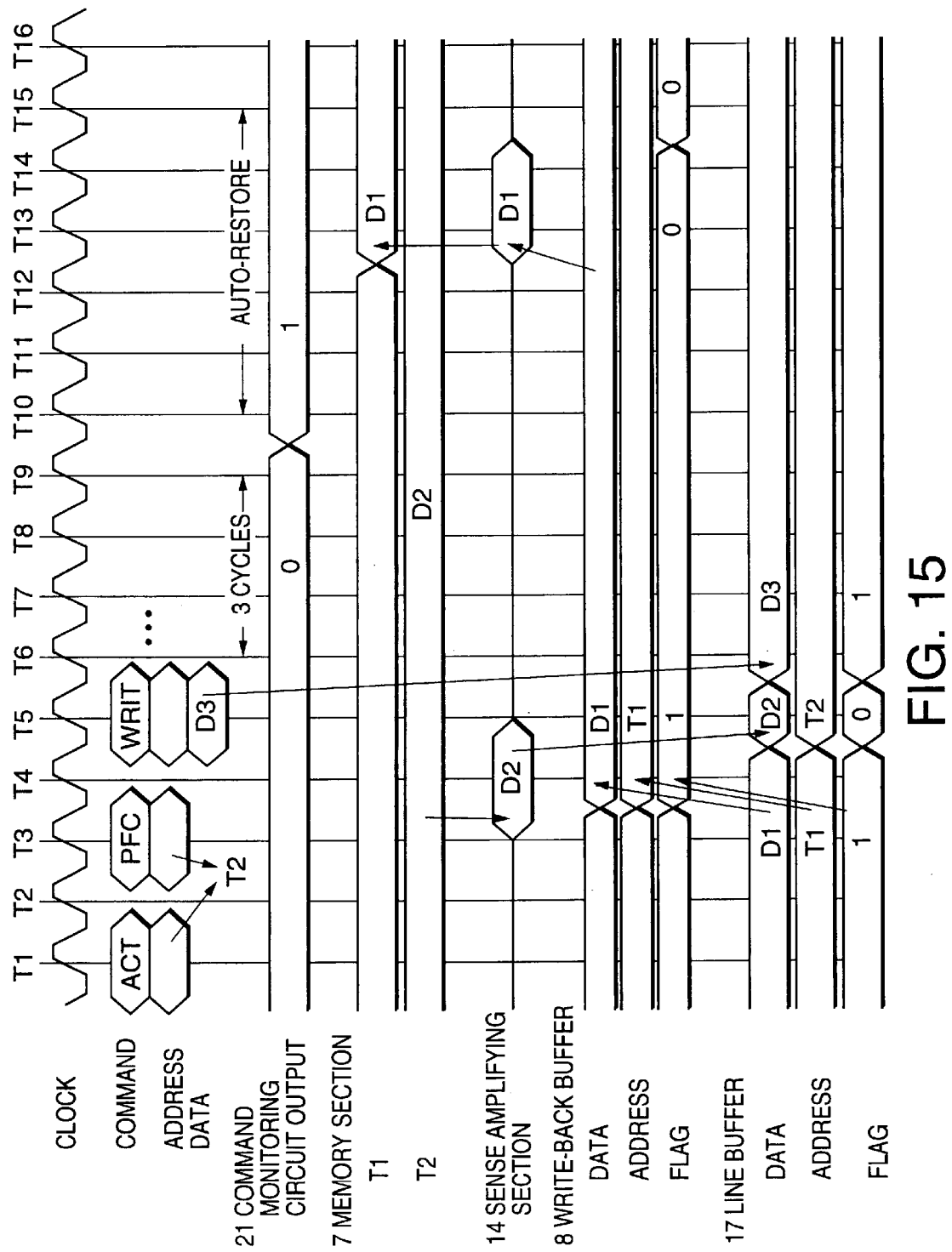
FIG. 15 is a timing chart for explaining a typical LSI operation of the multiple line buffer type memory LSI shown in FIG. 14.

FIG. 15 is a timing chart for explaining a typical operation of the multiple line buffer type memory LSI shown in FIG. 12, using the commands and addresses shown in FIG. 12.

In FIG. 15, the state of the flag 20 is represented by 1 when write-back is necessary, and by 0 when it is not necessary. The output of the command monitoring circuit 21 is represented by 1 when there is no command input for a certain period of time (three cycles in the case shown), and 0 for the other cases. The flag 20 is updated as follows:

1. All the flags 20 are set to 0 in the initial state.
2. When a new segment is transferred from the memory section 7 to the line buffer 17 (under the prefetching (PFCA) command), the flag 20 of that line buffer 17 is updated to 0.
3. Upon write-back from outside to the line buffer 17 (under the write (WRIT) command), the flag of that line buffer 17 is updated to 1.
4. Upon data transfer from the line buffer 17 to the write-back buffer 18, the flag 20 is simultaneously transferred.
5. Upon the completion of the data write-back operation from the write-back buffer 18 to the memory section 7, the flag 20 for that write-back buffer 18 is updated to 0.

First, at time T1, the bank activating (ACT) command is entered into the command input terminal group 2, and the bank address (B) and the row address (Row) are entered into the address input terminal group 1.

In the control circuit 6, under the above-mentioned bank activating (ACT) command, the page in the memory cell array 13 specified by the bank address (B) and the row address (Row) is read out into the sense amplifying section 14 during a period of time T1 through time T3.

Then, at time T3, the prefetching (PFCA) command is entered into the command input terminal group 2, and the bank address (B), the segment address (Seg), the line buffer number (Ch) and the write-back buffer number (Wb) are entered into the address input terminal group 1.

In the control circuit 6, under the above-mentioned prefetching (PFCA) command, the data of the line buffer 17 specified by the line buffer number (Ch), the address tag 19 and the flag 20 are first copied into the write-back buffer 18 specified by the write-back buffer number (Wb). Subsequently, the segment specified by the segment address (Seg) is written from the sense amplifying section 14 into the line buffer 17 specified by the line buffer number (Ch). Simultaneously with this, the bank address (B) and the row address (Row) entered together with the bank activating (ACT) command at time T1, and the segment address (Seg) entered together with the prefetching (PFCA) command at time T3 are written tag 19 of that line buffer 17, and the flag 20 is updated to 0. At time T5, the bank 11 specified by the bank address (B) is initialized.

At time T5, the write (WRIT) command to the effect of writing the data of the line buffer 17 prefetched at time T3 has been entered into the command input terminal group 2. In the control circuit 6, under the above-mentioned write (WRIT) command, the data are written into the line buffer 17 specified by the line buffer No. (Ch), and the flag 20 thereof is updated to 1.

Since there is not input of a command during the period of time T6 through time T9, output from the command monitoring circuit 21 is 1 at and after time T10. Furthermore, because there is a write-back buffer 18 having a flag 20 of 1, the control circuit 6 automatically starts data write-back operation. This write-back operation is performed by the use of the address tag 19 of the write-back buffer 18 to be written back.

Upon the completion of the data write-back operation, in the control circuit 6, the bank 11 is initialized, and the flag 20 of the write-back buffer 18 is updated to 0.

In this embodiment, as mentioned above, the data write-back operation from the write-back buffer 18 to the memory section 7 is automated by means of the command monitoring circuit 21. It is not therefore necessary to enter the restore (RSTA) command and command input can be efficiently carried out. It is also possible to simply conduct control of this multiple line buffer type memory LSI from outside.

Fifth Embodiment

Figure 16:
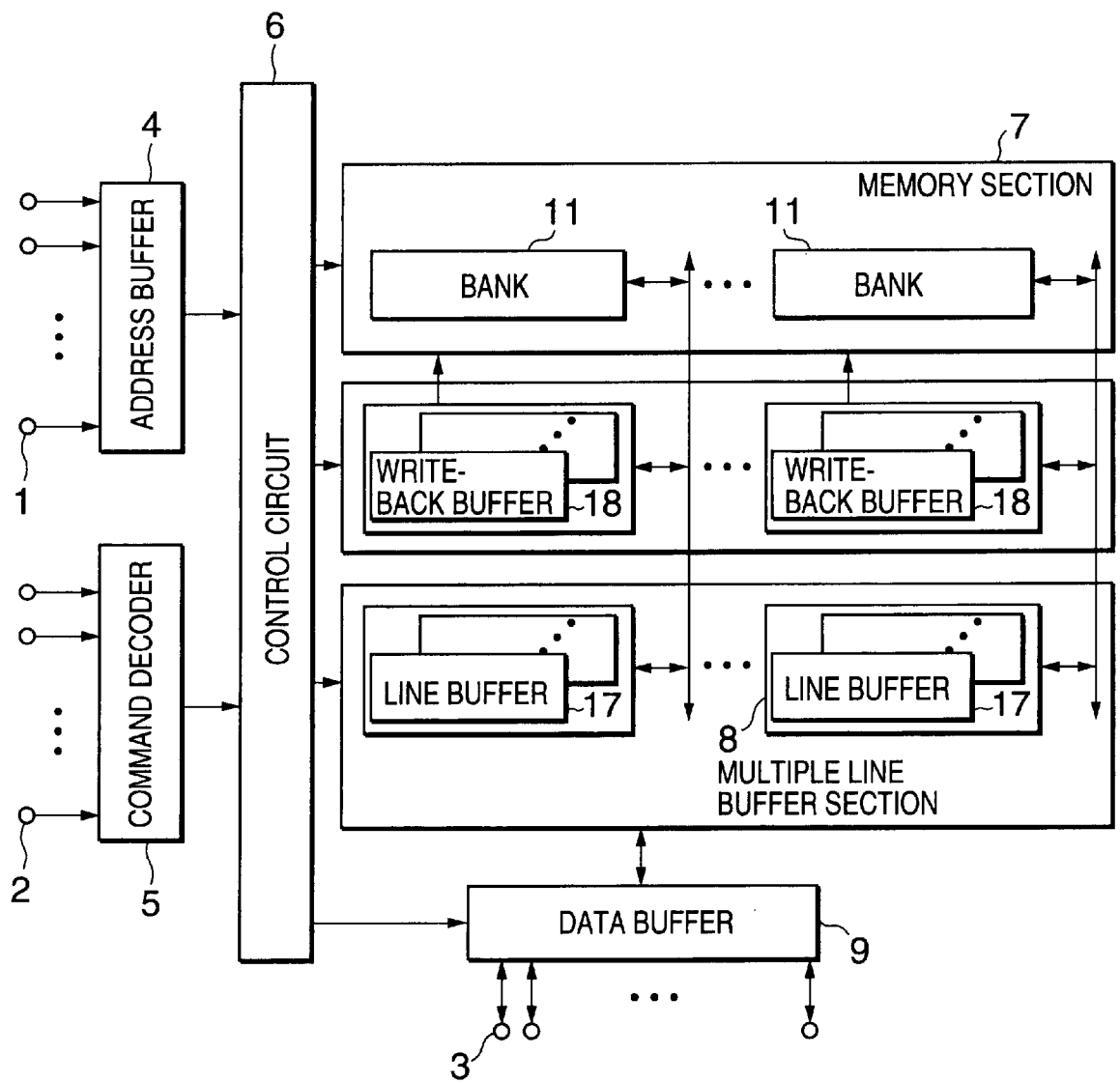
FIG. 16 is a block diagram illustrating a fifth embodiment of the multiple line buffer type memory LSI of the invention.

Referring to FIG. 16, description will be made about a fifth embodiment of a multiple line buffer type memory LSI according to this invention.

In this embodiment, as illustrated in FIG. 16, special write-back buffers 18 and line buffers 17 are dedicated to the individual banks 11, and data transfer between a bank 11 and the write-back buffer 18 and the line buffer 17 assigned to the bank is carried out through a special data line.

By assigning special write-back buffer 18 and line buffer 17 for each bank 11 as described above, it is possible to independently conduct control of the individual banks 11 and cause all the banks 11 to operate simultaneously. This permits achievement of a higher memory access speed.

Sixth Embodiment

Figure 17:
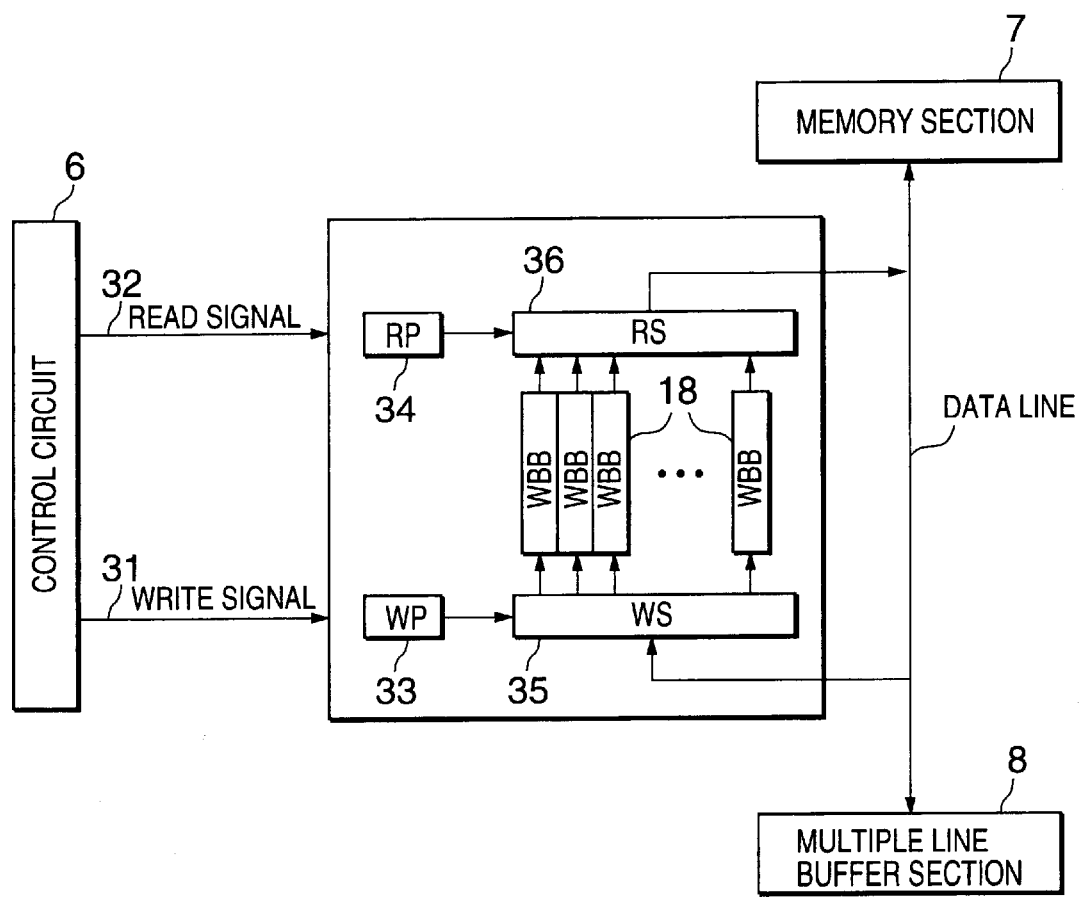
FIG. 17 is a block diagram illustrating a sixth embodiment of the multiple line buffer type memory LSI of the invention.

Referring to FIG. 17, description will be made about a sixth embodiment of a multiple line buffer type memory LSI according to this invention.

As illustrated in FIG. 17, this embodiment has a configuration with so-called FIFO (First-In-First-Out) type buffers in which write-back buffers (WBB) 18 are read out in the sequence of write-in thereof. For example, two pointer registers including a write pointer register (WP) 33 and a read point register (RP) 34 are used.

WP 33, RP 34, a write data selector (WS) 35, and a read data selector (RS) 36 are provided around the write-back buffers 18. Write signals 31 and read signals 32 are entered as input signals into the write-back buffers 18.

WP 33 and RP 34 are registers for holding identification numbers for identifying the individual write-back buffers 18. Values of WP 33 and RP 34 represent the write-back buffers 18 carrying out next write and read.

WS 35 writes data entered via a data line from the multiple line buffer section 8 into the write-back buffer 18 indicated by WP 33.

RS 36 reads out data from the write-back buffer 18 indicated by RP 34, and transfers the data to the memory section 7 via the data line.

The write signal 31 and the read signal 32 are signals for updating WP 33 and RP 34, respectively, and are generated in, and output from, the control circuit 6.

Figure 18:
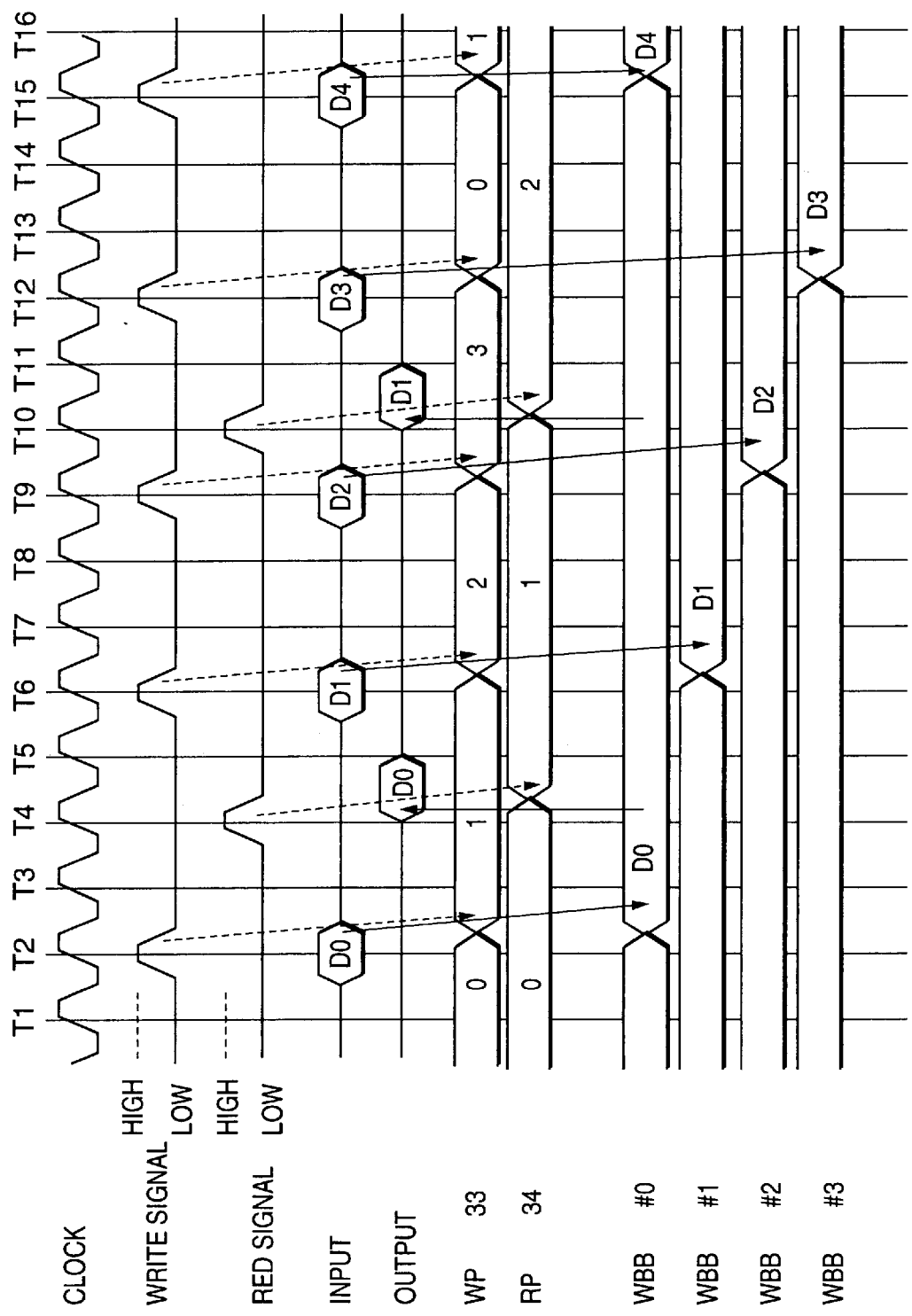
FIG. 18 is a timing chart for explaining a typical LSI operation of the multiple line buffer type memory LSI shown in FIG. 17.

FIG. 18 is a timing chart for explaining typical operations of the multiple line buffer type memory LSI shown in FIG. 17. A configuration using four write-back buffers 18 will be described. WP 33 and RP 34 are set to 0 upon initialization. The value increases by 1 when the write signal 31 and the read signal 32 become on a high level, and are reset to 0 when the retained value is 3.

At time T2, the write signal 31 generated in the control circuit 6 reaches a high level, and data D0 is entered into WS 35 via the data line.

Because WP 33 shows 0 at this point in time, the data D0 is written into the 0 th write-back buffer 18 (WBB#0), and the value of WP 33 changes from 0 to 1.

Similarly, at times T6, T9, T12 and T15, the write signal 31 generated in the control circuit 6 reaches a high level, and data D1, D2, D3 and D4 are entered into WS 35 via the data line.

At times T6, T9, T12 and T15, the value of WP 33 changes from 1 to 2, 3, and then 0. The data D1, D2, D3 and D4 are therefore written in the first, second, third and the 0th write-back buffers 18 shown in WP 33, respectively.

At time T4, on the other hand, the read signal generated in the control circuit 6 is on a high level.

Since RP 34 shows 0 at this point in time, the data D0 retained in the 0th write-back buffer 18 (WBB#0) is output to the data line via RS 36, and the value of RP 34 is updated from 0 to 1.

Similarly, at time T10 also, the read signal 32 generated in the control circuit 6 is on a high level. Because RP 34 indicates 1 at this point in time, the data D1 held in the first write-back buffer 18 (WBB#1) is output to the data line through RS 36, and the value of RP 34 is updated from 1 to 2.

In this embodiment, as described above, write-back buffers 18 under FIFO-type control are provided. The necessity to control the write-back buffers 18 with an external controller is eliminated, and it is possible to simplify the equipment configuration of the external controller.

Seventh Embodiment

Figure 19:
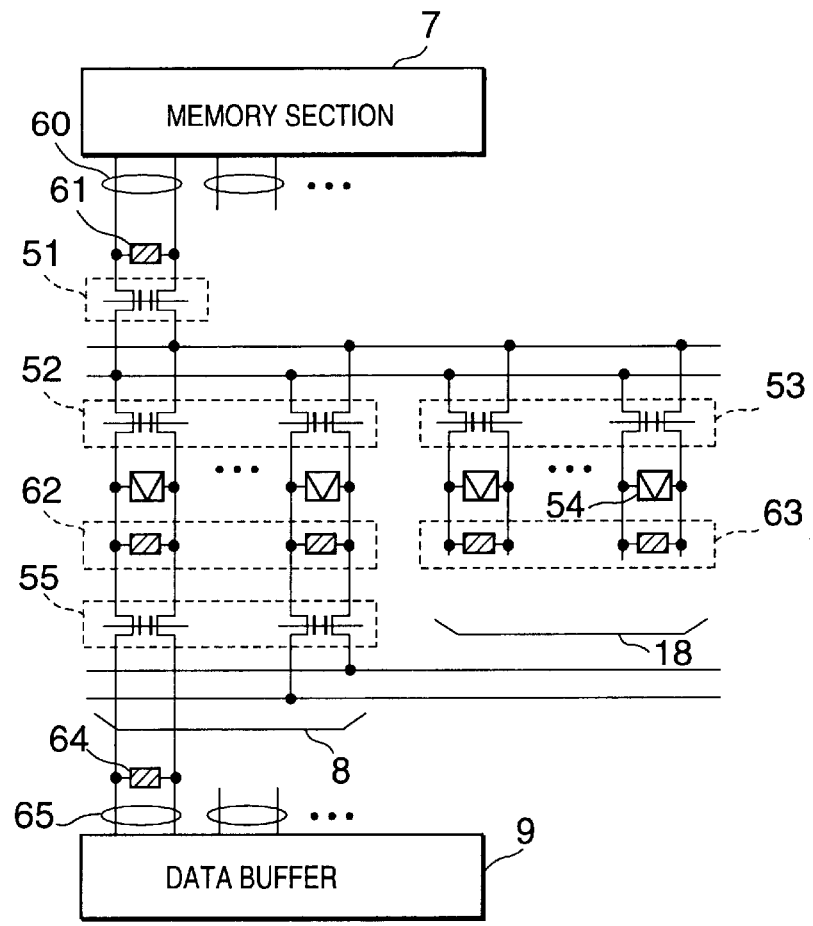
FIG. 19 is a block diagram illustrating a seventh embodiment of the multiple line buffer type memory LSI of the invention.

Referring to FIG. 19, description will be made about a seventh embodiment of a multiple line buffer type memory LSI according to this invention.

As illustrated in FIG. 19, the memory section 7, the multiple line buffer section 8 and the write-back buffers 18 are mutually connected via data line pairs each comprising two wiring lines. In addition, switches for selecting conduction or cutoff state are provided for the memory section 7, the multiple line buffer section 8 and the write-back buffers 18.

When data transfer is conducted between the memory section 7, the multiple line buffer section 8, and the write-back buffers 18, the data line pairs are initialized (precharged) to a certain reference potential prior to transferring the data, and data transfer is carried out by giving a micro-potential difference from this state to the data line pairs.

Figure 20:
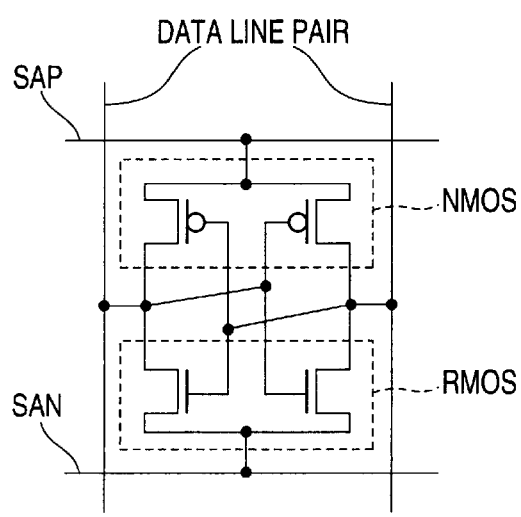
FIG. 20 is a block diagram illustrating a typical configuration of the buffer circuit with an amplifying function shown in FIG. 19.

Each of the line buffers 17 in the multiple line buffer section 8 (see FIG. 20) comprises a line buffer switch (line buffer SW) 52 for selecting conduction or cutoff state of that line buffer relative to the data line switch (data line SW) 51; a buffer circuit 54 with an amplifying function for retaining data by amplifying the micro-potential difference; a line buffer precharging circuit (line buffer PRE) 62 which precharges the buffer circuit 54 with an amplifying function and the wiring lines connected thereto; and a data input/output switch (data I/O SW) 55 which selects conduction or cutoff state of the line buffer relative to the data input/output line pair 65.

Each of the write-back buffers 18 includes a write-back buffer switch (write-back buffer SW) 53 which selects conduction or cutoff state of that write-back buffer relative to the data line SW 51; a buffer circuit 54 with an amplifying function for retaining data by amplifying the micro-potential difference of the data line pair; and a write-back buffer precharging circuit (write-back buffer PRE) 63 which precharges the buffer circuit 54 with an amplifying function and the wiring line pairs connected thereto.

A data line pair precharging circuit (data line PRE) 61 for precharging and a data input/output line pair precharging circuit (data I/O PRE) 64 are connected to the data line pair 60 and the data input/output line pair 65.

In a state in which all data transfer operations are discontinued (idle state), all the switches (the data line SW 51, the line buffer SW 52, the write-back SW 53 and the data input/output SW 55) are cut off, and all the precharging circuits (the data line PRE 61, the line buffer PRE 62, the write-back PRE 63 and the data input/output PRE 64) are in stoppage. The data line pair 60 and the data input/output line pair 65 are precharged.

Steps for data transfer between the memory section 7, the multiple line buffer section 8 and the write-back buffer 18 will now be described. The operations described in the following paragraphs are carried out under control by the control circuit 6.

Data transfer from the memory section 7 to the line buffers 17 in the multiple line buffer section 8 begins with an idle state, and conducted in the following steps.

First, energizing and operating the line buffer SW 52 and the line buffer PRE 62 of the line buffer 17 to be written, and precharging the line buffer 17; upon the completion of precharging, discontinuing the line buffer PRE 62 (step A1).

Then, keeping conductive state of the data line SW 51, and giving a micro-potential difference to the data line pair 60 (step A2).

Successively, activating the buffer circuit 54 with an amplifying function of the line buffer 17 performing write, and amplifying the micro-potential difference of the data line pair 60 by means of this buffer circuit 54 with an amplifying function; when the micro-potential difference is amplified by at least a certain amount, cutting off the data line SW 51 and the line buffer SW 52 (step A3). Subsequently, precharging the data line pair 60 by means of the data line PRE 61, and bring it back to the idle state (step A4). Data transfer from the line buffer 17 in the multiple line buffer section 8 to the write-back buffer 18 begins with the idle state and is carried out in the following steps.

Energizing and operating the write-back buffer SW 53 and the write-back buffer PRE 63 of the write-back buffer 18 performing write, and precharging the write-back buffer 18; upon the completion of precharging, stopping the write-back buffer PRE 63 (step B1).

Next, bringing the line buffer SW 52 of the line buffer 17 to be read out in energized state, and causing propagation of the micro-potential difference to the write-back buffer 18 (step B2).

Then, activating the buffer circuit 54 with an amplifying function of the write-back buffer 18 for write, and amplifying the micro-potential difference by means of the buffer circuit 54 with an amplifying function for retention; when the micro-potential difference by more than a certain amount, cutting off the line buffer SW 52 and the write-back buffer SW 53 to return to the idle state (step B3).

Data transfer from the write-back buffer 18 to the memory section 7 is started from the idle state, and is carried out in the following steps.

First, making conductive the data line SW 51 and the write-back buffer SW 53 of the write-back buffer 18 to be read out, and transmitting the micro-potential difference to the data line pair 60 (step C1).

Then, at the moment when the micro-potential difference exceeds a certain value, disconnecting the write-back buffer SW 53 and the data line SW 51 (step C2).

Next, amplifying the potential difference of the data line pair 60 of the memory section 7 and writing the data in the memory cell array 13 (see FIG. 1) (step C3).

Subsequently, precharging the data line pair 60 by means of the data line PRE 61 to bring it back to the idle state (step C4).

FIG. 18 is a block diagram illustrating a typical configuration of the buffer circuit 54 with an amplifying function shown in FIG. 17. FIG. 18 illustrates a configuration using each two N-type transistors (NMOS) and two P-type transistors (PMOS) commonly used in the industry.

In the buffer circuit 54 with an amplifying function in this configuration, the signal line SAP is on a high level, and the signal line SAN is fixed at a low-level potential; high-level and low-level potentials are complementarily retained for the data line pair in the data holding state. In the precharged state, the signal lines SAP and SAN and the data line pair are fixed at the same potential.

When writing data, a differential potential is given to the data line pair in the precharged state, and subsequently, the signal lines SAP and SAN are brought to a high level and a low level, individually, whereby the differential potential is amplified in the data retaining state.

In this embodiment, as described above, the memory section 7, the multiple line buffer section 8 and the write-back buffers 18 are mutually connected via data line pairs each having two wiring lines per bit, and switches are provided to make conductive or disconnected the memory section 7, the multiple line buffer section 8 and the write-back buffers 18 to the data line pairs. It is therefore possible to independently control data transfer between the line buffers 17 in the multiple line buffer section 8 and the memory section 7, and between the line buffers 17 and the data buffers 9 (the data input/output terminal group 3). As a result, it is possible to achieve efficient memory access and a higher speed of access.

Eighth Embodiment

Figure 21:
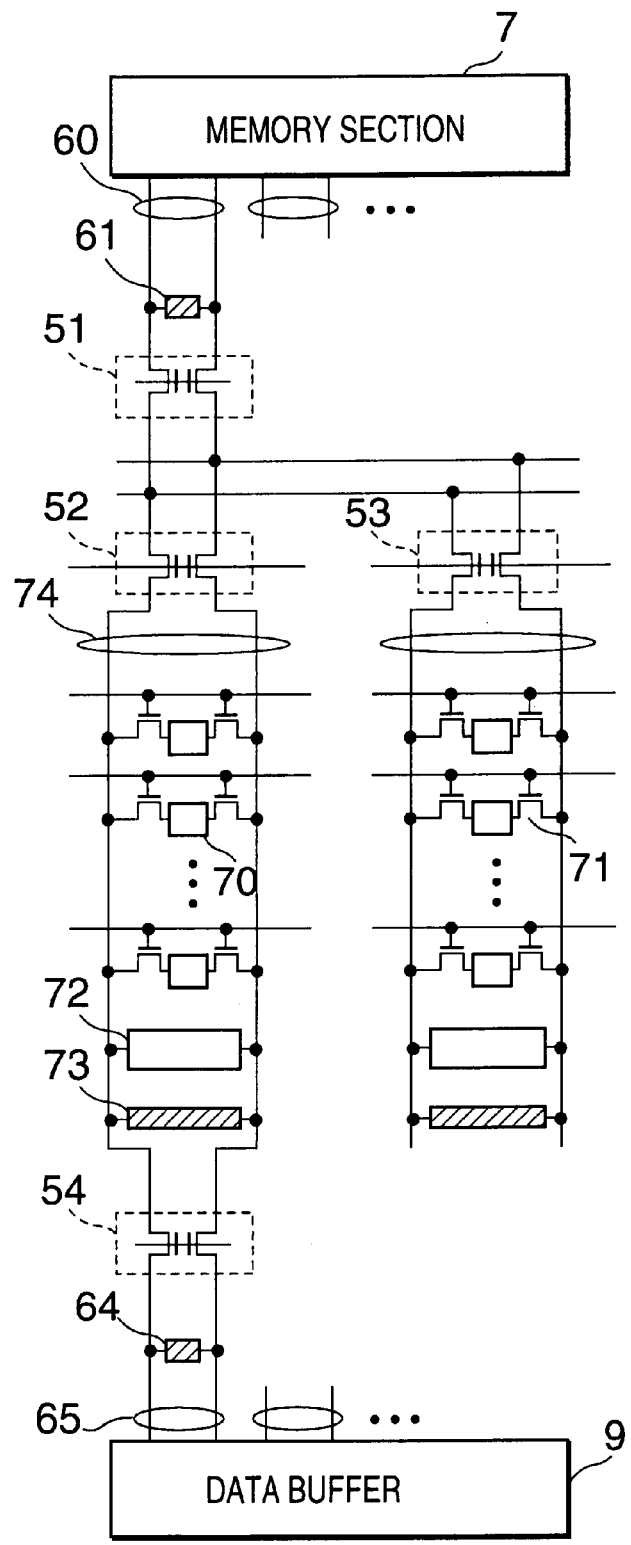
FIG. 21 is a block diagram illustrating an eighth embodiment of the multiple line buffer type memory LSI of the invention.

Referring to FIG. 21, description will be made about an eighth embodiment of a multiple line buffer type memory LSI according to this invention.

As illustrated in FIG. 21, this embodiment is characterized in that the buffer circuit 54 with an amplifying function shown in FIG. 19 is divided into a buffer circuit 70 retaining data and a buffer sense amplifier (buffer SA) 72 which amplifies a given micro-potential difference. Data transfer between the memory section 7, the multiple line buffer section 8 and the write-back buffers 18 is the same as in the multiple line buffer type memory LSI shown in FIG. 19.

Each of the line buffers 17 and the write-back buffers 18 includes a buffer circuit 70, a buffer sense amplifier (buffer SA) 72, and a buffer precharging circuit (buffer PRE 73).

The buffer SA 72 and the buffer PRE 73 are connected to a bit line pair 74, and the buffer circuit 70 is connected to the bit line pair 74 via an access transistor 71.

The access transistor 71 achieves conduction or disconnected state of the connection between the buffer circuit 70 and the bit line pair 74.

The bit line pair 74 of the line buffer 17 is connected to the line buffer SW 52 and the data input/output SW 54, and the bit line pair 74 of the write-back buffer 18 is connected to the write-back buffer SW 53.

Data transfer between the memory section 7, the multiple line buffer section 8 and the write-back buffers 18 is performed in the same manner as in the multiple line buffer type memory LSI shown in FIG. 19. However, because the buffer circuit 70 and the buffer SA 72 are separated, the precharge operation of the buffer circuit 70 and the write operation of the buffer SA 72 are different to each other.

The buffer circuit 70 is precharged by energizing the access transistor 71 connected to the buffer circuit 70 to be precharged, and operating the precharging circuit connected to the access transistor 71 via the bit line pair 74.

Write to the buffer circuit 70 is accomplished by bringing the access transistor 71 of the buffer circuit 70 for writing into a conductive state, activating the buffer SA 72 from the precharged state, and amplifying the given micro-potential difference.

In this embodiment, as mentioned above, it is possible to reduce the layout area for the line buffers and the write-back buffers by configuring the line buffers and the write-back buffers with a cell array using the bit line pair.

According to the present invention, as described above, one or more write-back buffers for holding copies of data in the line buffers are provided. When there is no line buffer for holding data read out from the memory section, data retained in any of the plurality of line buffers are copied and temporarily retained in the write-back buffers.

Data transfer from the line buffers to the write-back buffers can be carried out at a higher speed than in data transfer from the line buffers to the memory section. Unless data in the write-back buffers are rewritten, data write-back operation can be performed at any time to the memory section. It is therefore possible to immediately carry out access to the line buffers after temporarily holding copies of line buffer data in the write-back buffers, and thus to reduce delays in memory access caused by data write-back operation.

When data write-back operation from the write-back buffers to the memory section is automatically conducted on the basis of the result of detection in the command monitoring circuit, it is not necessary to enter the command to instruct data write-back operation (restore command) into the command input terminal group. It is therefore possible to perform efficient command input. Control of this multiple line buffer type memory LSI can be conducted easily from outside.

When an address tag which retains addresses specifying places in the memory to each of the line buffers and write-back buffers is provided, it is not necessary to conduct address control for the data write-back operation from the write-back buffers to the memory section by means of an external controller provided outside. It is therefore possible to simplify the external controller, and reduce the number of terminals of the address input terminal group of this multiple line buffer type memory LSI.

When the memory section comprises a plurality of banks, and a plurality of write-back buffers and a plurality of line buffers are provided to correspond to the plurality of banks, it is possible to independently control the plurality of banks, and simultaneously operate the plurality of banks. This in turn permits achievement of a higher memory access speed.

When the write-back buffers comprise FIFO-type buffers, it is not necessary to control the write-back buffers by means of an external controller provided outside. This permits simplification of the equipment configuration of the external controller.

When the memory section, the line buffers and the write-back buffers are mutually connected via data line pairs, and switches are provided for selecting conductive or disconnected state of the memory section, the line buffers and the write-back buffers relative to the data line pairs, it is possible to independently control data transfer between the line buffers and the memory section and between the line buffers and the data input/output terminal group. It is thus possible to achieve efficient memory access and a higher access speed.

While this invention has thus far been disclosed in conjunction with several embodiments thereof, it will be readily possible for those skilled in the art to put this invention into practice in various other manners.

What is claimed is:

1. A memory LSI, comprising:

a data input/output terminal group for input/output of data;

a memory section which writes and reads data entered or output via the data input/output terminal group;

a multiple line buffer section which has a plurality of line buffers for retaining data previously read out from the memory section, said line buffers being accessed upon memory access;

a control circuit which controls a total operation; and a write-back buffer which retains copies of the data in the line buffers;

where the line buffer retaining the data read out from the memory section does not exist in a multiple line buffer section, the control circuit copies the data retained in any of the line buffers, causes the write-back buffer to temporarily retain the copies of data, then, causes the line buffer to retain the data read out from the memory section, and writes back the data temporarily retained in said write-back buffer to the memory section.

2. The memory LSI as claimed in claim 1, wherein:

the memory LSI has a command input terminal group which is given with a command for indicating operational contents with respect to the memory LSI; and the control circuit copies the data retained in any of the line buffers, causes the write-back buffer to temporarily retain the copies of data, and then, causes the line buffer to retain the data read out from the memory section in response to the command entered into the command input terminal group.

3. The memory LSI as claimed in claim 2, wherein:

the control circuit permits write-back of the data temporarily retained in the write-back buffer into the memory section.

4. The memory LSI as claimed in claim 2, wherein:

the memory LSI has a command monitoring circuit which detects as to whether or not the command has been entered into the command input terminal group within a predetermined period; and the control circuit automatically writes back the data temporarily retained in the write-back buffer into the memory section based upon a detection result in the command monitoring circuit.

5. The memory LSI as claimed in claim 1, wherein:

the memory LSI has an address input terminal group which is given with an address of indicating a place where the data in the memory LSI are stored;

each of the line buffer and the write-back buffer has an address tag retaining an address specifying the place in the memory from among addresses entered into the address input terminal group;

when the data read out from the memory section is retained in the line buffer, the control circuit writes the address used for the read operation in the address tag of the line buffer;

while when the data retained in the line buffer are copied and retained temporarily in the write-back buffer, the control circuit writes the address retained in the address tag of the line buffer into an address tag of the write-back; and writes back the data temporarily retained in the write-back buffer into the memory section by using the address retained in the address tag of the write-back buffer.

6. The memory LSI as claimed in claim 1, wherein:

the memory section comprises a plurality of banks; and a plurality of the line buffers and the write-back buffers are provided in accordance with the plurality of banks.

7. The memory LSI as claimed in claim 1, wherein:

the write-back buffer comprises an FIFO type buffer from which the data are read out in the sequence of write of the data; and the control circuit writes back the data retained in the write-back buffer into the memory section in the sequence in which the data of the line buffer have been retained in said write-back buffer.

8. The memory LSI as claimed in claim 1, wherein:

the multiple line buffer type memory LSI has a data line pair having two wiring lines for connecting said memory section, the line buffer and the write-back buffer to each other; and the memory section, the line buffer and said write-back buffer perform mutual data transfer by a micro-potential difference from a certain reference potential of the data line pair.

9. The memory LSI as claimed in claim 8, further comprising:

switches for switching over the data line pair between a turn-on state and a turn-off state of the memory section, the line buffer and the write-back buffer; and buffer circuits with amplifying function for amplifying the micro-potential difference of the data line pair, arranged in the line buffer and the write-back buffer.

* * * * *